(12) United States Patent
Patel

(10) Patent No.: US 9,672,110 B1
(45) Date of Patent: Jun. 6, 2017

(54) TRANSMISSION TIME REFINEMENT IN A STORAGE SYSTEM

(71) Applicant: Amazon Technologies, Inc., Seattle, WA (US)

(72) Inventor: Rajesh Shanker Patel, Bellevue, WA (US)

(73) Assignee: Amazon Technologies, Inc., Reno, NV (US)

( * ) Notice: Subject to any disclaimer, the term of this patent is extended or adjusted under 35 U.S.C. 154(b) by 69 days.

(21) Appl. No.: 14/862,003

(22) Filed: Sep. 22, 2015

(51) Int. Cl.
*G11C 29/00* (2006.01)
*G06F 11/10* (2006.01)
*H03M 13/37* (2006.01)

(52) U.S. Cl.
CPC ...... *G06F 11/1092* (2013.01); *G06F 11/1072* (2013.01); *G06F 11/1076* (2013.01); *G11C 29/765* (2013.01); *H03M 13/373* (2013.01)

(58) Field of Classification Search
CPC ............. G06F 11/1072; G06F 11/1068; G06F 11/1092; G06F 11/1076; G06F 2212/214; G06F 221/10921; G11C 29/765
See application file for complete search history.

(56) References Cited

U.S. PATENT DOCUMENTS

| | | | |
|---|---|---|---|
| 5,113,515 A | | 5/1992 | Fite et al. |
| 5,581,774 A | | 12/1996 | Yoshitake et al. |
| 8,504,535 B1 * | | 8/2013 | He ................... G06F 17/30902 707/695 |
| 8,806,296 B1 * | | 8/2014 | Lazier ................ G06F 3/0604 711/112 |
| 8,972,603 B1 | | 3/2015 | Brandwine |
| 2014/0278747 A1 | | 9/2014 | Gumm |
| 2014/0281815 A1 * | | 9/2014 | Baptist ............... G06F 12/0646 714/766 |
| 2014/0359287 A1 * | | 12/2014 | Veugen ................ H04L 9/008 713/167 |

FOREIGN PATENT DOCUMENTS

EP   2637111   9/2013

OTHER PUBLICATIONS

U.S. Appl. No. 14/133,575, filed Dec. 18, 2013, Donlan.
(Continued)

*Primary Examiner* — Shelly A Chase
(74) *Attorney, Agent, or Firm* — Robert C. Kowert; Meyertons, Hood, Kivlin, Kowert & Goetzel, P.C.

(57) ABSTRACT

A storage manager may be used to perform a decoding operation using a transmission time refinement technique on a data object stored in a storage system, such as an object-redundant storage system. The decoding operation may include requesting groups of corresponding blocks from storage devices of the storage system. The storage manager may maintain connections to a connection group of the storage devices and may iteratively request corresponding blocks of the data object from one or more various request groups of the storage devices of the connection group. The storage manager may evaluate performance of the request groups in sending the corresponding blocks of the data object and may modify the membership of the request groups for requests for subsequent blocks of the data object based at least in part on the performance of the request groups.

21 Claims, 13 Drawing Sheets

(56) References Cited

OTHER PUBLICATIONS

U.S. Appl. No. 14/543,827, filed Nov. 17, 2014, Sorenson, III, et al.
U.S. Appl. No. 14/570,952, filed Dec. 15, 2014, Sieklucki, et al.
U.S. Appl. No. 14/589,916, filed Jan. 5, 2015, Sorenson, III.
U.S. Appl. No. 14/589,919, filed Jan. 5, 2015, Sorenson, III.
U.S. Appl. No. 14/862,013, filed Sep. 22, 2015, Patel.

* cited by examiner

TRANSMISSION TIME REFINEMENT IN A STORAGE SYSTEM

BACKGROUND

Modern computing applications require storage of large amounts of data. Over time, the need to storage and retrieve large amounts of data continues to increase. Other common concerns are the ability to store data durably and efficiently. Durability typically refers to the ability to recover data in the event of a failure. Data durability typically requires some form of redundancy in how the data is stored. For example, data may be mirrored to two different storage devices such that an exact replica copy of the data is stored on both storage devices. If one of the storage devices fails, the data can still be retrieved from the other storage device. Some systems desire even stronger levels of durability that involve more complex redundancy encoding scheme that allow the data to still be retrieved even after multiple device failures. Techniques to provide data durability typically incur some amount of overhead, both in terms of the amount of additional storage required and computational overhead, and thus are at odds with the desire to be able to store and retrieve large amounts of data efficiently.

Web-based applications, cloud computing, and other network and Internet based technologies are an area frequently requiring storage of large amounts of data with needs for durability and efficiency. The conventional Web model allows clients to access Web resources (e.g., applications, services and data) via an HTTP client program, such as a Web browser. A technology referred to as Web services has been developed to provide programmatic access to Web resources. Web services may be used to provide programmatic access to Web resources including technology platforms (e.g., applications and services) and data (e.g., product catalogs and other databases) hosted on Web-connected computers such as Web server systems via a Web service interface. Generally speaking, a Web service interface may be configured to provide a standard, cross-platform API (Application Programming Interface) for communication between a client requesting some service to be performed and the service provider. In some implementations, a Web service interface may be configured to support the exchange of documents or messages including information describing the service request and response to that request. Such documents, or messages, may be exchanged using standardized Web protocols, such as the Hypertext Transfer Protocol (HTTP), for example, and may be formatted in a platform-independent data format, such as eXtensible Markup Language (XML), for example.

One example of a service that is provided to clients via a Web service interface is a data storage service. A typical data storage service (which may be referred to herein as an "object-redundant storage system") may receive requests to store data objects on behalf of storage service clients, and may store those data objects using redundancy in order to provide a high level of durability for the stored data. For example, such a data storage service may replicate the objects it stores across different storage nodes to increase the likelihood that object data will survive the failure of any given storage node. In such systems, until a certain minimum number of replicas (e.g., two or three) of an object have been successfully written the write operation may not be considered to be completed. However, for a given object, the actual number of valid replicas (or instances) of that object might at some points in time be less than the target number, for a variety of reasons, and a replacement process may be invoked to correct the situation. For example, if a previously valid replica becomes inaccessible due to a failure of the device on which it was stored, the failed device may be replaced in the system, and another instance of the replica may be written to the replacement device. In some systems, each replica need not correspond to an exact copy of the object data. For example, in some object-redundant storage systems, an object may be divided into a number of portions or "shards" according to a redundant encoding scheme (such as a parity, error correction code or other scheme), such that the object data may be recreated from fewer than all of the generated portions. Typically, object-redundant storage systems may be also seek to improve performance characteristics, such as latency, throughput or availability.

Figure 1A:
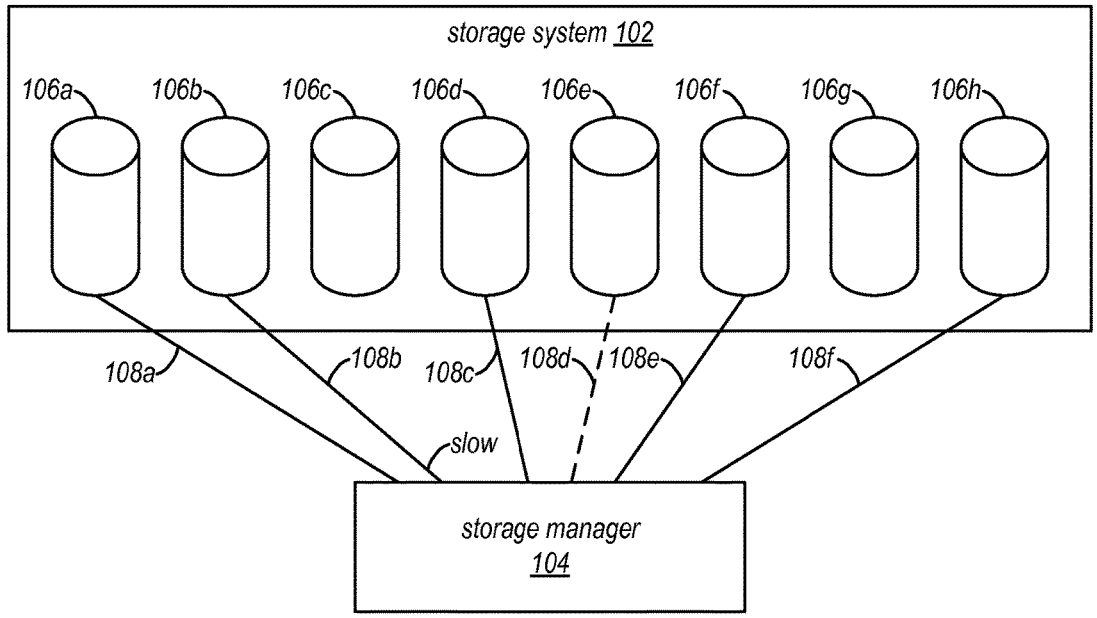
FIG. 1A is a block diagram illustrating operations of an example system that refines transmission times of blocks of a data object.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

In some cases, storage service clients may be more concerned about data storage costs than they are about performance-related parameters such as latency, throughput or availability. For example, a client may be willing to trade away some or all of these performance constraints to achieve a more cost-effective storage solution for archival storage, where the data should be stored with some durability, and will be stored for a long time, but it is not going to be accessed very often (if at all). The systems and methods described herein may provide a storage service that is well suited for such storage models, and for other storage models in which the storage service does not store the only instances of the stored data. The storage services described herein as may in some embodiments provide very low cost storage with granular failure detection, and may be offered to storage service clients as a network-based service. These services may in some embodiments be used to build highly durable storage solutions on top of lower cost infrastructures (e.g., the storage systems described herein). Note that in the descriptions that follow, the terms "storage service" and "storage system" may be used somewhat interchangeably to refer to the functionality provided by a storage service or to an underlying computing system (and/or various components thereof) that is configured to implement that functionality.

In some embodiments, a storage manager of the storage systems described herein may receive a request for a data object stored at the storage system according to an encryption technique. The storage manager may be configured to decode a plurality of "shards" into the data object using a decoding matrix. Each shard may be stored on a different storage device (e.g., to provide additional failure protection). Additionally, each shard may include a plurality of blocks, where the storage manager is configured to decode corresponding blocks (e.g., a first 128 bytes of data in each shard) into a corresponding block of the data object. Accordingly, the storage manager may decode the data object by decoding a series of blocks, as opposed to waiting to receive all blocks of a set of shards and then decoding the entire data object.

As a non-limiting example, an erasure encoding scheme may be used in which additional data (e.g., redundant data) is added to a data object to create an expanded data object. The expanded data object may be divided into n shards. However, in this example, only k shards are necessary to recreate the data object. As just one specific example, an erasure encoding scheme may be used in which 20 shards are generated for a data object (n=20), and 11 shards are required to recreate the data object (k=11). As another example, an erasure encoding scheme may be used in which 40 shards may be generated for a data object (n=40), with 10 shards required to recreate the data object (k=10). Similarly, k corresponding blocks may be used to recreate a block of the data object. Different blocks may be recreated using corresponding blocks of different groups of shards (e.g., block 1 of the data object may be recreated using block 1 of shards 1-11 and block 2 of the data object may be recreated using block 2 of shards 5-15). Note that, even if shards are lost from a storage system that implements the redundant encoding scheme, if at least k shards remain, generally no data is lost, as the remaining shards should include sufficient information to recreate the data object (e.g., the original data object).

As described in more detail herein, a process of requesting blocks of a data object in response to a data object request may be refined (e.g., by the storage manager) such that storage devices that do not respond quickly to requests for blocks of the data object may not be used to obtain other blocks of the data object. Accordingly, the storage manager may receive the blocks more quickly, as compared to a system where blocks are always requested from a same set of storage devices. Additionally, the storage manager may use less network resources, as compared to a system where all storage devices that include shards of the data object are sent requests for shards.

Further, as described in more detail herein, portions of a data object decoding process may be pipelined such that, in one embodiment, a set of blocks of the data object are being requested from the storage system, a different set of blocks of the data object are being decoded, and at least one block is being sent to the client simultaneously. Accordingly, the blocks of the data object may be decoded and sent to the client more quickly, as compared to a system where the data object decoding process is not pipelined.

Figure 1B:
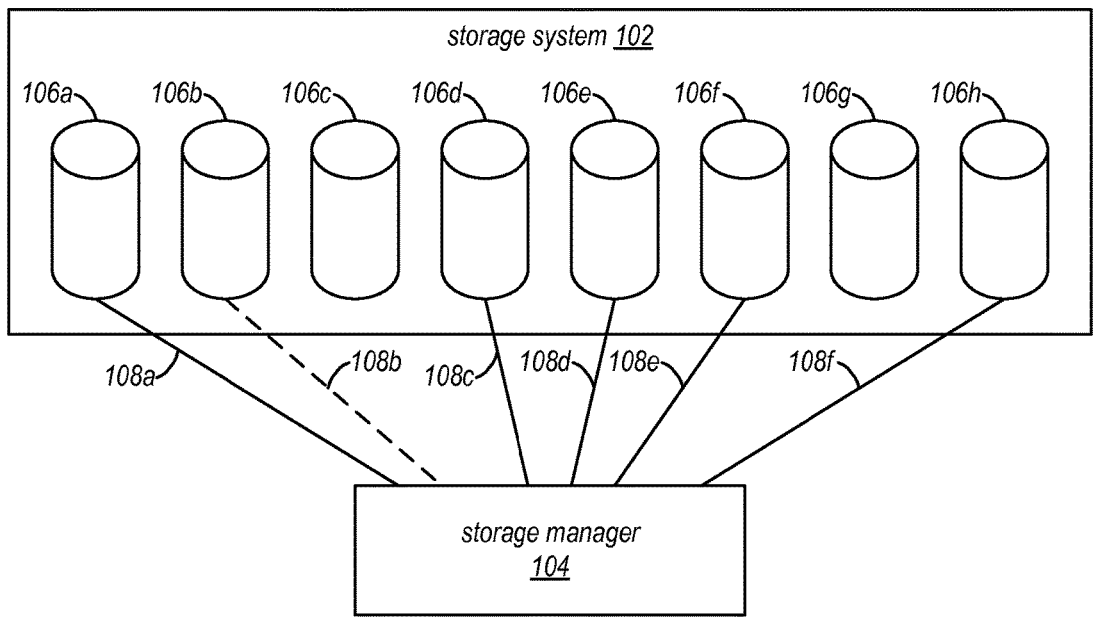
FIG. 1B is a block diagram illustrating operations of an example system that refines transmission times of blocks of a data object.

FIGS. 1A and 1B are block diagrams illustrating operations of an example system that refines transmission times of blocks of a data object. In this example, the system includes a storage system 102 configured to store a plurality of encoded data objects and a storage manager 104 configured to decode the encoded data objects (e.g., by decoding blocks of the encoded data objects). In the illustrated embodiment, the storage system 102 is a distributed system including a plurality of storage devices 106a-h, where the storage devices 106a-h are configured to store different shards of an encoded data object. The shards may include respective pluralities of corresponding encoded blocks of the data object. In the non-limiting, illustrated example, eight shards are stored and five blocks are used to reconstruct a block of the data object. However, in other embodiments, other numbers of shards may be stored, the system may use a different number of blocks to reconstruct a block of the data object, or both. Additionally, in other embodiments, the storage system 102 further includes storage devices that do not store shards of the encoded data object.

As part of a process of reconstructing blocks of a data object, the storage manager 104 forms and maintains connections 108a-f with at least a portion of the storage devices 106a-h that store shards of the data object. As described further with respect to FIG. 2, the storage devices that have the connections 108a-f maintained with the storage manager 104 are described herein as being a "connection group." The connections 108a-f may be used by the storage manager 104 to request corresponding encoded blocks of the data object (e.g., so the storage manager 104 can reconstruct a corresponding block of the data object) from a subset of the connection group, described herein as a "request group." Additionally, the connections 108a-f may be used by the storage system 102 to send blocks of the data object to the storage manager 104. The connections 108a-f may be maintained such that the connections 108a-f do not need to be reestablished (e.g., via a connection initiation process) for the storage manager 104 to request encoded blocks corresponding to another block of the data object. Performance data (e.g., throughput, response latency, error rate, etc.) corresponding to the connection group may vary over time (e.g., due to network congestion, device load, device failures, etc.).

As described herein, a "subset" refers to a group that includes some, but not all, members of a larger group. For example, a subset of a group of ten storage devices may include at least one of the storage devices and no more than nine of the storage devices, in any combination.

FIGS. 1A and 1B illustrate two different requests for different groups of corresponding blocks of a data object. In FIGS. 1A and 1B, a same connection group is utilized but different request groups are utilized as part of a transmission time refinement process. In particular, both figures illustrate a connection group of storage devices 106a, 106b, 106d, 106e, 106f, and 106h, as denoted by connections 108a-f. In FIG. 1A, the storage manager 104 requests a corresponding block (or blocks) of a data object from each of a request group of storage devices 106a, 106b, 106d, 106f, and 106h, as denoted by the solid lines. However, in the illustrated example, storage device 106b may return the requested corresponding block (or blocks) undesirably slowly.

As illustrated by FIG. 1B, based on the storage device 106b sending the requested corresponding block slowly, the storage manager 104 may send a subsequent request for a different group of corresponding blocks of the data object to a different request group that does not include the storage device 106b (e.g., including storage device 106e instead). In some cases, the storage device 106e may return one or more requested corresponding blocks more quickly, as compared to the storage device 106b. Because the storage manager 104 maintained the connection 108d with the storage device 106e, the storage manager 104 may not need to perform a connection initiation process to add the storage device 106e to the request group. Accordingly, in some cases, as part of an iterative process, the storage manager 104 may be configured to attempt to utilize storage devices that meet certain performance criteria regarding response time (e.g., despite potential time-varying factors that may impact response time, such as network congestion or device load). Additionally, network resources may be utilized more efficiently, as compared to a system where all of the storage devices 106a-h are included in the request group.

Figure 2:
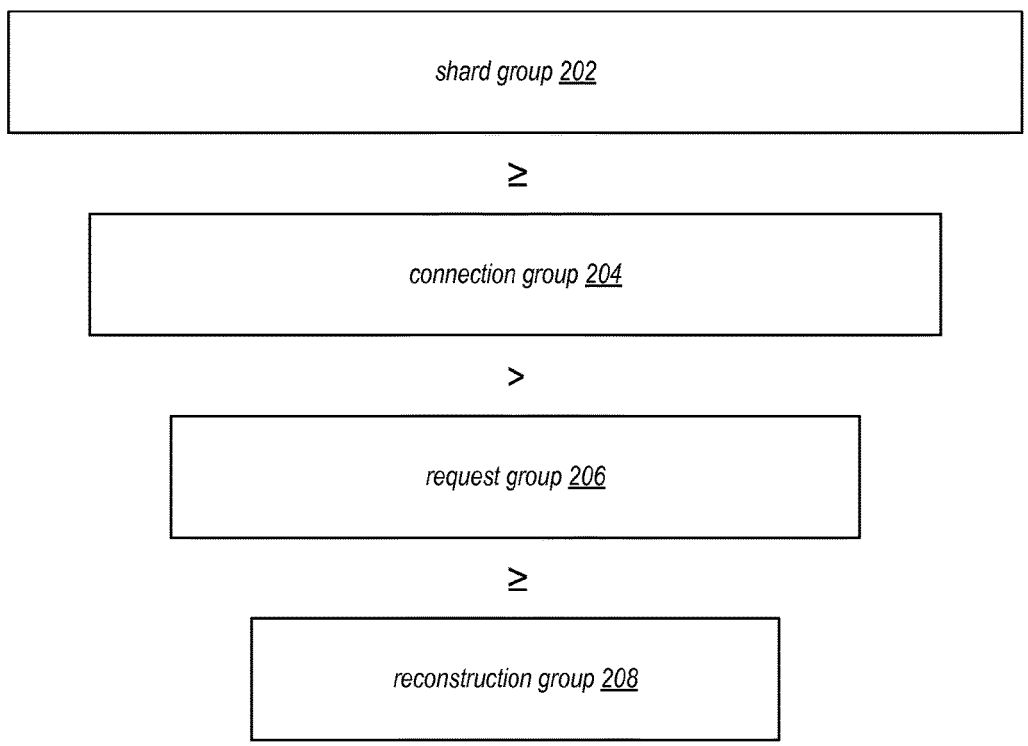
FIG. 2 is a hierarchical diagram illustrating relationships between groups identified by an example system that refines transmission times of blocks of a data object.

FIG. 2 illustrates relationships between groups identified by an example system that refines transmission times of blocks of a data object. In particular, FIG. 2 illustrates a shard group 202, a connection group 204, a request group 206, and a reconstruction group 208 and relationships between the various groups.

The shard group 202 refers to all storage devices that store respective shards of a requested data object in a storage system. For example, with reference to FIGS. 1A and 1B, the shard group 202 may refer to storage devices 106a-h. The respective shards include a plurality of blocks, where corresponding blocks of a particular number of shards can be decoded into a block of the data object. As noted above, not all shards may be needed to reconstruct the data object. Additionally, the storage system may include more storage devices than are included in the shard group 202.

The connection group 204 refers to all storage devices in the storage system that a storage manager maintains connections to during a reconstruction process. For example, with reference to FIGS. 1A and 1B, the connection group 204 may refer to storage devices 106a, 106b, 106d, 106e, 106f, and 106h. The connection group 204 may include all storage devices of the shard group 202 or may include fewer storage devices than the shard group 202. However, the connection group 204 may include more storage devices (and thus has access to more shards) than are needed to reconstruct the data object.

In the system described above with reference to FIGS. 1A and 1B, membership of the connection group 204 is not modified during reconstruction of a data object (membership in the connection group 204 is determined prior to sending requests to the storage devices and is maintained throughout the iterative reconstruction process). However, in other embodiments, membership in the connection group 204 may be modified (e.g., based on a particular storage device consistently performing poorly). For example, storage devices in the connection group 204 may be replaced with other storage devices from the shard group 202 (and not in the connection group 204) based at least in part on performance data of the storage devices relative to performance criteria (e.g., a threshold throughput, a threshold response latency, a threshold error rate, etc.). As another example, a number of storage devices in the connection group 204 may be increased (thus increasing a number of possible combinations of storage devices in the request group 206) in response to detecting a particular number of underperforming storage devices.

The request group 206 refers to all storage devices in the storage system that a storage manager requests blocks from as part of a particular block request operation (which may request one corresponding block or several corresponding blocks from each member of the request group 206). For example, with reference to FIG. 1A, the request group 206 may refer to storage devices 106a, 106b, 106d, 106f, and 106h. As another example, with reference to FIG. 1B, the request group 206 may refer to storage devices 106a, 106d, 106e, 106f, and 106h. The request group 206 may be a subset of the connection group 204 such that at least some connections are not used for a particular block request operation.

In the system described above with reference to FIGS. 1A and 1B, membership of the request group 206 is not modified for a particular group of corresponding blocks after sending requests to the storage devices for the particular group of corresponding blocks (membership in the request group 206 is for the particular group of corresponding blocks requested in FIG. 1A and may be modified prior to requesting a different particular group of corresponding blocks in FIG. 1B). However, in other embodiments, as described further with reference to FIG. 4B, membership in the request group 206 may be modified (e.g., adding one or more storage devices from the connection group 204 to the request group) for the particular group of corresponding blocks in response to the request group 206 failing to meet one or more performance measures (e.g., based on the request group 206, as evaluated collectively, performing poorly). membership in the connection group 204 may be modified (e.g., based on a particular storage device consistently performing poorly). In some embodiments, a number of storage devices in a new request group (e.g., the request group of FIG. 1B) may be equal to an original number of storage devices in a previous request group (e.g., prior to adding additional storage devices from the connection group 204).

The reconstruction group 208 refers a minimum number of storage devices in the storage system where corresponding blocks from the storage devices can be used to reconstruct a block of the data object. In other words, the number of storage devices in the reconstruction group 208 is equal to the number of corresponding encoded blocks that are needed to reconstruct a block of the data object. The reconstruction group 208 may include all storage devices of the request group 206 or may include fewer storage devices than the request group 206. When the request group 206 is larger than the reconstruction group 208 (e.g., the reconstruction group 208 is a subset of the request group 206), the reconstruction group 208 may correspond to a first set of corresponding blocks received by the storage manager. For example, if at least 10 encoded blocks are needed to reconstruct a block, the request group 206 may refer to 12 storage devices from which encoded blocks are requested and the reconstruction group 208 may refer to the first 10 storage devices that return the requested encoded blocks. In some embodiments, as a way of efficiently using storage space in the storage system, double the size of the reconstruction group 208 may be larger than the size of the shard group 202. However, in other embodiments (e.g., upon request by a client), the shard group 202 may be larger than double the size of the reconstruction group 208.

Figure 3:
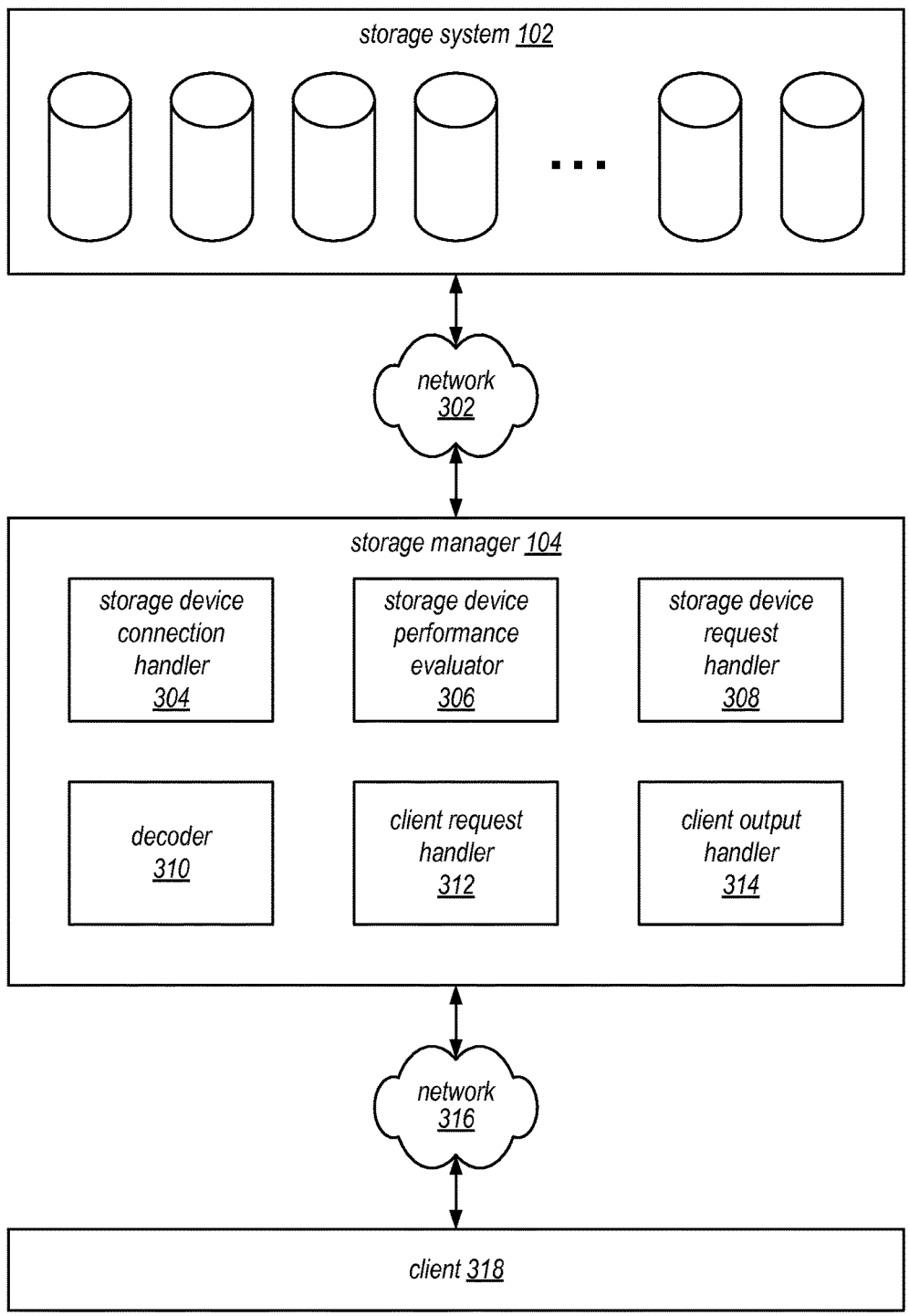
FIG. 3 is a block diagram illustrating a service system architecture that may be configured to decode data objects.

FIG. 3 is a block diagram illustrating operations of an example service system architecture that may be configured to decode data objects while using a transmission time refinement technique. In this example, the system includes the storage system 102 and the storage manager 104 of FIGS. 1A and 1B. However, in other embodiments the storage system 102, the storage manager 104, or any combination thereof differ from the storage system and storage manager discussed in FIGS. 1A and 1B. The system also includes a network 302 that links the storage system 102 to the storage manager 104, a client 318 that may request the data object, and a network 316 that links the client 318 to the storage manager 104. The storage manager 104 includes a storage device connection handler 304, a storage device performance evaluator 306, a storage device request handler 308, a decoder 310, a client request handler 312, and a client output handler 314. In some embodiments, the system only includes a single network (e.g., a single network that connects the storage manager 104 to the storage system 102 and to the client 318.

This disclosure will describe a process of receiving a request for a data object, decoding the data object, and returning the data object using a transmission time refinement technique.

As noted above, the storage system 102 may be configured to store a plurality of data objects on behalf of various clients according to a sharding technique using corresponding pluralities of storage devices (e.g., that form various shard groups). In some embodiments, clients, such as the client 318, may request, to storage manager 104 via network 316, a data object stored at the storage system 102 on the client's behalf. Accordingly, in the illustrated embodiment, client request handler 312 is configured to receive a request for a data object from client 318.

In some embodiments, the storage manager 104 (e.g., using the storage device connection handler 304) is configured to determine a shard group of the storage system 102 and select, from the shard group, a connection group. In some embodiments, the connection group is selected randomly from the shard group. In other embodiments, the storage devices of the connection group are selected based on various criteria, such as network locality to the storage manager 104 or previous performance by the various storage devices.

As used herein, "network locality" refers to a number of network devices or nodes located in a most direct network path between two devices. In some cases, two devices may be physically within 5 feet of one another, but may not have a high network locality because a network path between the two devices may route through many other devices. In some cases, devices having a higher network locality may be able to send communications more quickly, as compared to devices having a lower network locality.

As discussed above, the data object may be iteratively decoded using a series of block requests. After forming at least some connections to the connection group, the storage device performance evaluator 306 may be configured to provide information to the storage device request handler 308 regarding how to select a request group to receive a first set of the block requests. In some embodiments, storage device request handler 308 is configured to select the request group randomly. In other embodiments, the storage device request handler 308 is configured to select the request group based on which storage devices of the connection group connected to the storage manager 104 the fastest, based on other criteria (e.g., network locality), or any combination thereof. The storage device request handler 308 may be configured to send the block requests to the request group of the storage devices. The block requests may request a group of corresponding blocks from the storage devices. In some cases, the block requests may request multiple corresponding blocks from the storage devices.

The storage device performance evaluator 306 may evaluate the performance of the storage devices in responding to the block requests. For example, the storage device performance evaluator 306 may determine respective performance data (e.g., respective throughput, respective response latencies, respective error rates, etc.) associated with the storage devices. The performance data may be based on transmission of all requested blocks, or based on transmission of some subset of the requested blocks (e.g., a first requested block, a last requested block, a median requested block, or any combination thereof). The storage device performance evaluator 306 may further compare the performance of the storage devices in responding to the block requests to various performance criteria. For example, as further described below with reference to FIG. 5, the storage device performance evaluator 306 may be configured to compare the respective performance data of the storage devices to performance criteria to determine whether the respective performance data fails to meet an absolute threshold (e.g., a fixed throughput, a fixed response latency, a fixed error rate, or any combination thereof), a relative threshold (e.g., a throughput threshold determined based on the throughputs of one or more other storage devices in the request group, corresponding thresholds for response latency or error rate, or any combination thereof), or both. The storage device performance evaluator 306 may identify any number of the storage devices (e.g., no storage devices, all storage devices, or any other number of storage devices) from the request group as being underperforming storage devices. The storage device performance evaluator 306 may be configured to send these evaluations to the storage device request handler 308.

Based at least in part on the evaluations from the storage device performance evaluator 306, the storage device request handler 308 may be configured to change the request group (e.g., by replacing one or more of the storage devices in the request group with one or more storage devices in the connection group but not in the request group) for a subsequent set of block requests. Accordingly, one or more underperforming storage devices may be removed from the request group. In some embodiments, the subsequent block requests may request more blocks than the first block request. For example, the first block request may only request 2 blocks from each storage device of the request group (e.g., so a potentially more efficient request group can be quickly identified). However, a second, subsequent block request may request 30 blocks from each storage device, using the new, potentially more efficient, request group (e.g., to reduce network traffic associated with sending data headers etc.).

In some embodiments, while the storage manager 104 is receiving at least some encoded blocks, requesting additional encoded blocks, or both, the storage manager 104 may have received enough blocks to decode a block of the data object. Accordingly, while blocks are being sent from the request group to the storage manager 104, the decoder 310 may reconstruct one or more blocks of the data object from a plurality of corresponding encoded blocks. The decoder 310 may send the reconstructed blocks to the client output handler 314 for transmission to the client 318.

The client output handler 314 may be configured to determine whether the client 318 is ready to receive the reconstructed blocks and to send, via the network 316, the reconstructed blocks to the client 318 individually, or as part of a larger transmission that includes multiple blocks (e.g., includes the entire data object). Similar to the decoder 310, in some embodiments, the client output handler 314 is configured to act while the storage manager 104 is receiving new blocks, requesting new blocks, or both. Additionally, the client output handler 314 may be configured to send blocks to the client 318 while the decoder 310 is decoding other blocks of the data object. Accordingly, portions of the transmission time refinement system described herein may be configured to act in a pipelined fashion, which may speed up a data object reconstruction and transmission process. In some embodiments, in response to detecting that the client 318 has received all of the blocks of the data object, the client output handler 314 may be configured to indicate to the client 318 that the entire reconstructed data object has been sent.

Figure 4A:
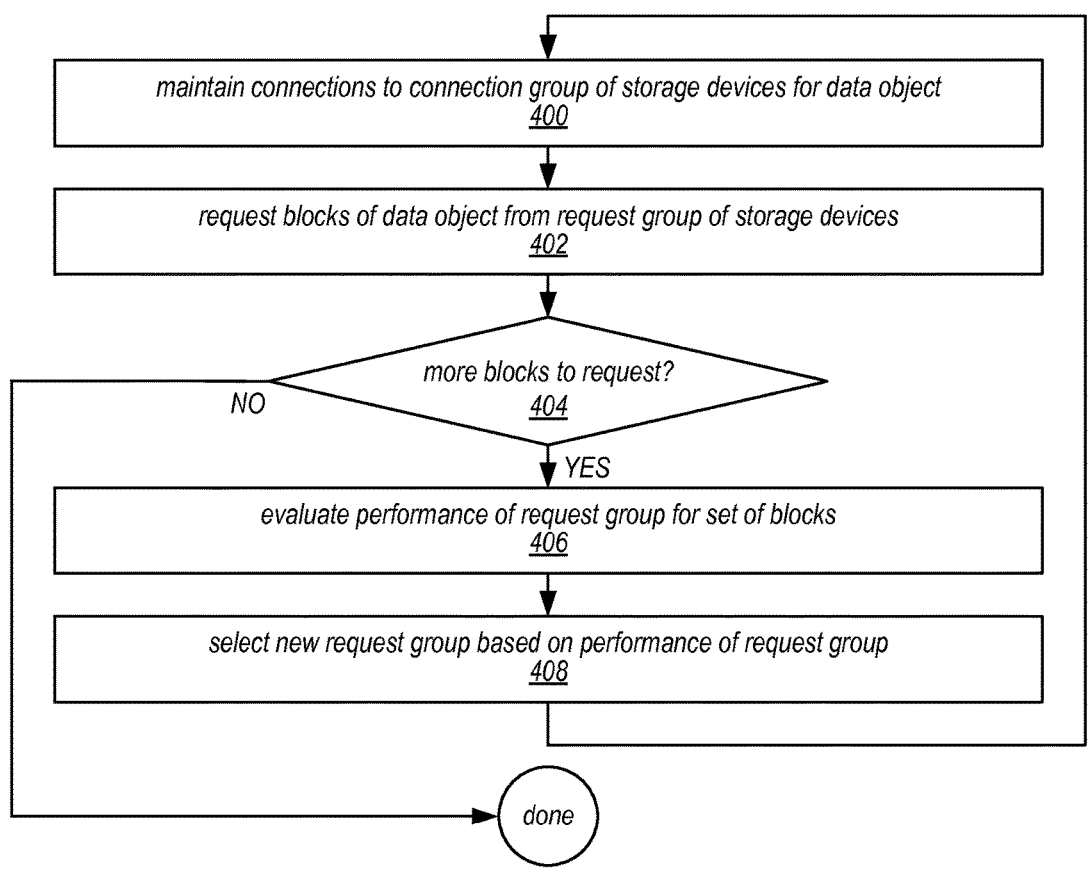
FIG. 4A is a flow diagram illustrating one embodiment of a method for refining transmission times of blocks of a data object.

As described above, in one example of a storage service, a client may request a data object from storage in a storage system that includes a plurality of data storage devices. A storage manager may iteratively retrieve the data object from storage by requesting various groups of corresponding blocks from various request groups. The storage manager may evaluate performance of the storage devices in supplying the requested blocks and may modify (or maintain) membership of the request group prior to a future request. One embodiment of a method for refining transmission times of blocks of a data object is illustrated by the flow diagram of FIG. 4A. Although FIG. 4A illustrates operations being performed in a particular order, in other embodiments, some operations may be performed in other orders or in parallel. In some embodiments, prior to performing the method of FIG. 4A, the storage manager may determine whether a requested data object is large enough to perform the method. For example, if the data object only includes a single block, the storage manager may decide not to perform the method.

As illustrated at 400, in this example, the method may include maintaining connections to a connection group of storage devices for a data object. For example, the storage manager 104 of FIG. 1A may maintain connections 108a-f to the connection group of storage devices 106a, 106b, 106d, 106e, 106f, and 106h. As illustrated at 402, in this example, the method may include requesting blocks of a data object from a request group of the storage devices. For example, the storage manager 104 may request blocks from a request group of storage devices 106a, 106b, 106d, 106f, and 106h.

As illustrated at 404, in this example, the method may include determining whether there are more blocks to request to reconstruct the data object. For example, the storage manager 104 may determine whether more encoded blocks of the data object need to be requested (or whether the storage manager 104 has requested encoded blocks corresponding to all blocks of the data object). If there are no more blocks to be requested, the method may complete. If there are more blocks to be requested, as illustrated at 406, in this example, the method may include evaluating performance of the request group for the set of requested blocks. For example, the storage manager 104 may evaluate performance of the request group, as described further below with reference to FIG. 5.

As illustrated at 408, in this example, the method may include selecting a new request group based at least in part on the performance of the request group. For example, in response to the storage device 106b providing a slow response to a request, the storage manager 104 may select a new request group of storage devices 106a, 106d, 106e, 106f, and 106h, as illustrated in FIG. 1B. In some cases, membership in the request group may be maintained (e.g., the new request group may be the same as the previous request group because all storage devices met the performance criteria). In some cases, some storage devices may be included in the new request group even if the storage devices did not meet the performance criteria, as described below with reference to FIG. 6. After selecting a new request group, the method may return to 400. Thus, the method of FIG. 4A may enable refining transmission times of blocks of a data object.

Figure 4B:
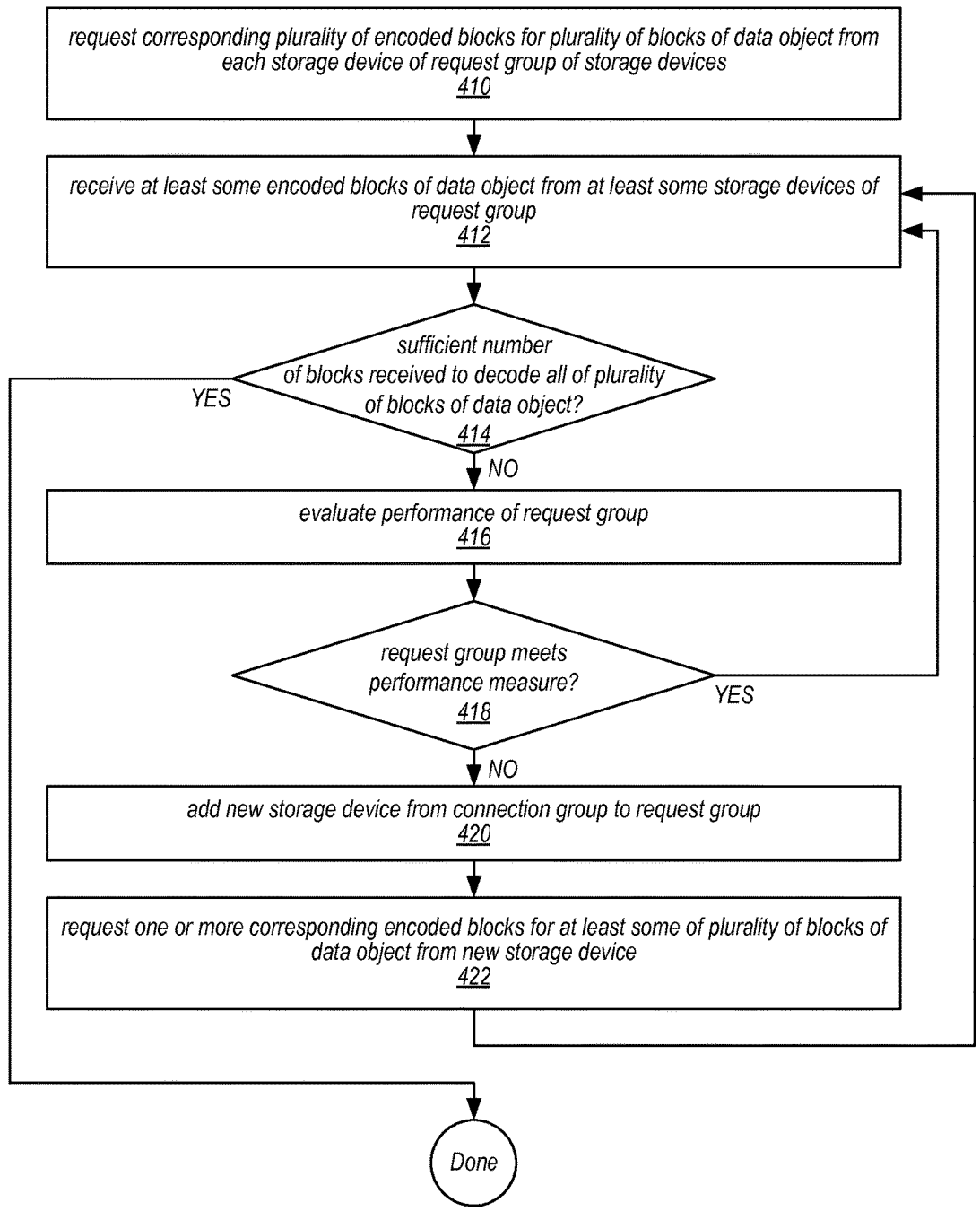
FIG. 4B is a flow diagram illustrating one embodiment of a method for refining transmission times of blocks of a data object requested from a request group.

As described above, in one example of a storage service, a client may request a data object from storage in a storage system that includes a plurality of data storage devices. A storage manager may retrieve the data object from storage by requesting various groups of corresponding blocks from various request groups. The storage manager may evaluate performance of the storage devices in supplying the requested blocks and may increase membership of the request group for a current request. One embodiment of a method for refining transmission times of blocks of a data object requested from a request group is illustrated by the flow diagram of FIG. 4B. Although FIG. 4B illustrates operations being performed in a particular order, in other embodiments, some operations may be performed in other orders or in parallel. In some embodiments, the method is performed subsequent to receiving a request for a data object and maintaining connections to a connection group of storage devices for the data object. Additionally, the method may be, in some cases, performed concurrently with portions of FIG. 4A.

As illustrated at 410, in this example, the method may include requesting a corresponding plurality of encoded blocks for a plurality of blocks of a data object from each storage device of a request group of storage devices. For example, the storage manager 104 may request a corresponding plurality of blocks from each of a request group of the storage devices 106a, 106b, 106d, 106f, and 106h. As illustrated at 412, in this example, the method may include receiving at least some encoded blocks of the data object from at least some storage devices of the request group. For example, the method may include receiving two encoded blocks from the storage device 106a, one encoded block from the storage devices 106d, 106f, and 106h, and no encoded blocks from the storage device 106b.

As illustrated at 414, in this example, the method may include determining whether a sufficient number of blocks have been received to decode all of the plurality of blocks of the data object (corresponding to the requested corresponding plurality of encoded blocks). For example, the storage manager 104 may determine whether a sufficient number of blocks have been received to decode all of the plurality of blocks of the data object identified at 410. If a sufficient number of blocks have been received to decode all of the plurality of blocks, the method may complete. If additional blocks need to be received to decode all of the plurality of blocks, as illustrated at 416, the method may include evaluating performance of the request group for the set of requested blocks. For example, the storage manager 104 may evaluate performance of the request group, as described further below with reference to FIG. 5.

As illustrated at 408, in this example, the method may include determining whether the request group meets a performance measure. For example, the storage manager 104 may determine whether the request group as a whole meets a performance measure, such as an average throughput, an average latency, an average error rate, or any combination thereof. Alternatively, the storage manager 104 may evaluate only a portion of the request group (e.g., a number of storage devices of the request group equal to a reconstruction group) to determine whether the request group meets the performance measure. In a particular embodiment, the storage manager 104 identifies a reconstruction group of the best performing storage devices of the request group according to the performance measure and determines whether the request group meets the performance measure using only performance data of a worst performing storage device of the reconstruction group according to the performance measure.

If the request group meets the performance measure, the method may return to 412. If the request group does not meet the performance measure, as illustrated at 420, the method may include adding a new storage device from the connection group to the request group. For example, the storage manager 104 may add the storage device 106e to the request group of the storage devices 106a, 106b, 106d, 106f, and 106h for execution of at least a portion of decoding the plurality of blocks of the data object. As illustrated at 422, in this example, the method may include requesting one or more corresponding encoded blocks for at least some of the plurality of blocks of the data object from the new storage device. For example, the storage manager 104 may have previously decoded a particular block of the storage device 106e, but may request corresponding encoded blocks usable, in combination with corresponding blocks of other storage devices of a shard group of the data object, to decode other blocks of the storage device 106e. After requesting the blocks, the method may return to 412.

In some cases, by increasing a size of the request group for the plurality of blocks, an amount of time needed to receive the sufficient number of blocks to decode all of the plurality of blocks of the data object identified at 410 may be reduced. In some embodiments, a selected new request group (e.g., selected at 408 of FIG. 4B) may include a number of storage devices equal to a previous request group size. In other embodiments, the selected request group may include a number of storage devices equal to a number of storage devices in the request group at the termination of the method of FIG. 4B or at a current stage of the method of FIG. 4B. Additionally, in some embodiments, a number of storage devices that can be added to the request group may be limited based on a number of storage devices in the connection group, or based on a request group increase limit (e.g., a specific limit that refers to a number of connections that can be added to a request group as part of a process of refining transmission times of blocks of a data object requested from a request group. Thus, the method of FIG. 4B may enable refining transmission times of blocks of a data object requested from a request group.

Figure 5:
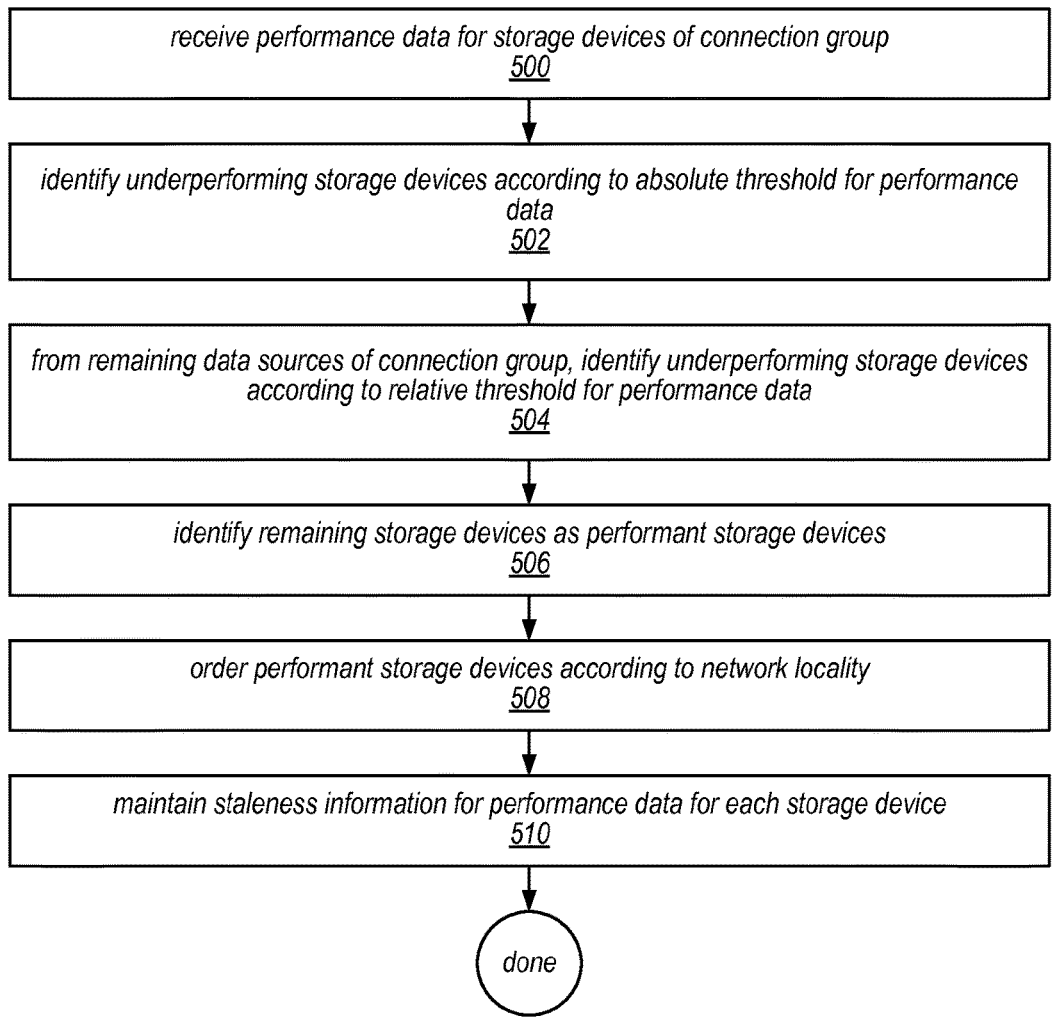
FIG. 5 is a flow diagram illustrating one embodiment of a method for evaluating performance of and classifying storage devices of a connection group.

As described above, a storage manager may select a new request group based at least in part on one or more storage devices of a previous request group failing to meet performance criteria. One embodiment of a method for evaluating performance of and classifying storage devices of a connection group is illustrated by the flow diagram of FIG. 5. Although FIG. 5 illustrates operations being performed in a particular order, in other embodiments, some operations may be omitted, performed in other orders, or performed in parallel. In some embodiments, FIG. 5 describes an operation performed as part of 406 and 408 of FIG. 4A.

As illustrated at 500, in this example, the method may include receiving performance data for storage devices of a connection group. For example, the storage manager 104 of FIG. 1A may receive performance data for the connection group of storage devices 106a, 106b, 106d, 106e, 106f, and 106h in response to various block requests. As illustrated at 502, in this example, the method may include identifying underperforming storage devices according to an absolute threshold for performance data. For example, the storage manager 104 may compare the performance data to an absolute (fixed) threshold. If any storage devices performed worse than the absolute threshold (e.g., had a throughput less than a threshold throughput, had a response latency slower than a threshold response latency, had an error rate less than a threshold error rate, had any combination of throughput, response latency, and error rate less than a corresponding threshold, etc.), the storage manager 104 may classify those storage devices as underperforming storage devices. As noted above, in some cases, no storage devices in the connection group may be identified as underperforming storage devices. In other cases, all storage devices of the connection group may be identified as underperforming storage devices.

As illustrated at 504, in this example, the method may include, from the remaining data sources of the connection group, identifying underperforming storage devices according to a relative threshold for performance data. For example, the storage manager 104 may determine whether additional storage devices are underperforming storage devices by comparing the performance data of the storage devices of the connection group. The relative threshold may be calculated based on average performance data, median performance data, or some sort of weighted average (e.g., at least in a 20th percentile of performance data). To illustrate, even if a storage device has a throughput meeting an absolute threshold, if the throughput is, as one, non-limiting example, ten times less than that of the other storage devices in the request group, the storage manager 104 may identify the storage device as an underperforming storage device. In some cases, no storage devices in the connection group may be identified as underperforming storage devices based on the relative threshold (e.g., because all storage devices had similar performance data). In some cases, 504 may be skipped (e.g., because all storage devices failed to meet the absolute threshold and are already identified as underperforming storage devices).

As illustrated at 506, in this example, the method may include identifying remaining storage devices as performant storage devices. In some cases, 506 may be skipped (e.g., because all storage devices in the connection group were identified as underperforming storage devices). In some cases, all storage devices in the connection group may be identified as performant storage devices. As illustrated at 508, in this example, the method may include ordering the performant storage devices according to network locality. For example, performant storage devices having a higher network locality may be given priority in being added to a new request group.

As illustrated at 510, in this example, the method may include maintaining staleness information for the performance data for each storage device. As discussed above, the performance data may be affected by one or more time-varying factors (e.g., network congestion, device load, etc.). Accordingly, as further described with reference to FIG. 6, staleness information for the performance data may be maintained so that underperforming storage devices having older performance data may be more likely to be included in a request group (e.g., in the hope that the storage devices are no longer underperforming). Thus, the method of FIG. 5 may enable evaluating performance of and classifying storage devices of a connection group.

Figure 6:
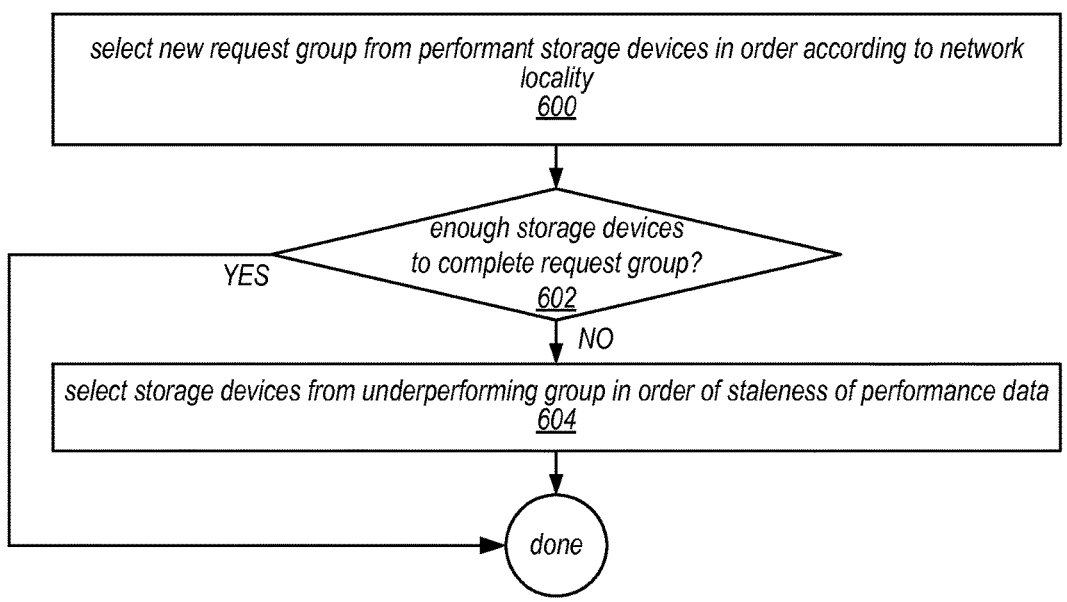
FIG. 6 is a flow diagram illustrating one embodiment of a method for selecting a request group.

As described above, a storage manager may evaluate performance of storage devices in supplying the requested blocks and may modify membership of the request group prior to a future request. One embodiment of a method for selecting a request group is illustrated by the flow diagram of FIG. 6. Although FIG. 6 illustrates operations being performed in a particular order, in other embodiments, some operations may be omitted, performed in other orders, or performed in parallel. In some embodiments, FIG. 6 describes an operation performed as part of 408 of FIG. 4A. Additionally, other methods for selecting a request group (e.g., randomly selecting new devices, based on a ranking of storage devices, etc.) may instead be used.

As illustrated at 600, in this example, the method may include selecting a new request group from performant storage devices in order according to network locality. For example, as described above with reference to FIG. 5, the storage manager 104 of FIG. 1A may have previously identified performant storage devices of a connection group in order according to network locality. In some embodiments, the storage manager may only select enough storage devices from the performant storage devices to complete the request group (e.g., not selecting one or more performant storage devices having a worse network locality than the selected storage devices). As illustrated at 602, in this example, the method may include determining whether the new request group includes enough storage devices. For example, the storage manager 104 may determine whether enough storage devices have been selected to form a request group. If enough storage devices are included in the new request group, the method terminates. Otherwise, the method proceeds to 604.

As illustrated at 604, in this example, the method may include selecting storage devices from an underperforming group in order of staleness of performance data. For example, the storage manager 104 may determine that the connection group includes insufficient performant storage devices to form a request group, and may select storage devices from the underperforming group, giving priority to storage devices having more stale performance data. As mentioned above, some factors that may affect whether a storage device is underperforming may be time-varying. Accordingly, by selecting storage devices in order of staleness of performance data, storage devices most likely to have different performance characteristics may be selected. Thus, the method of FIG. 6 may enable selecting a request group.

Figure 7A:
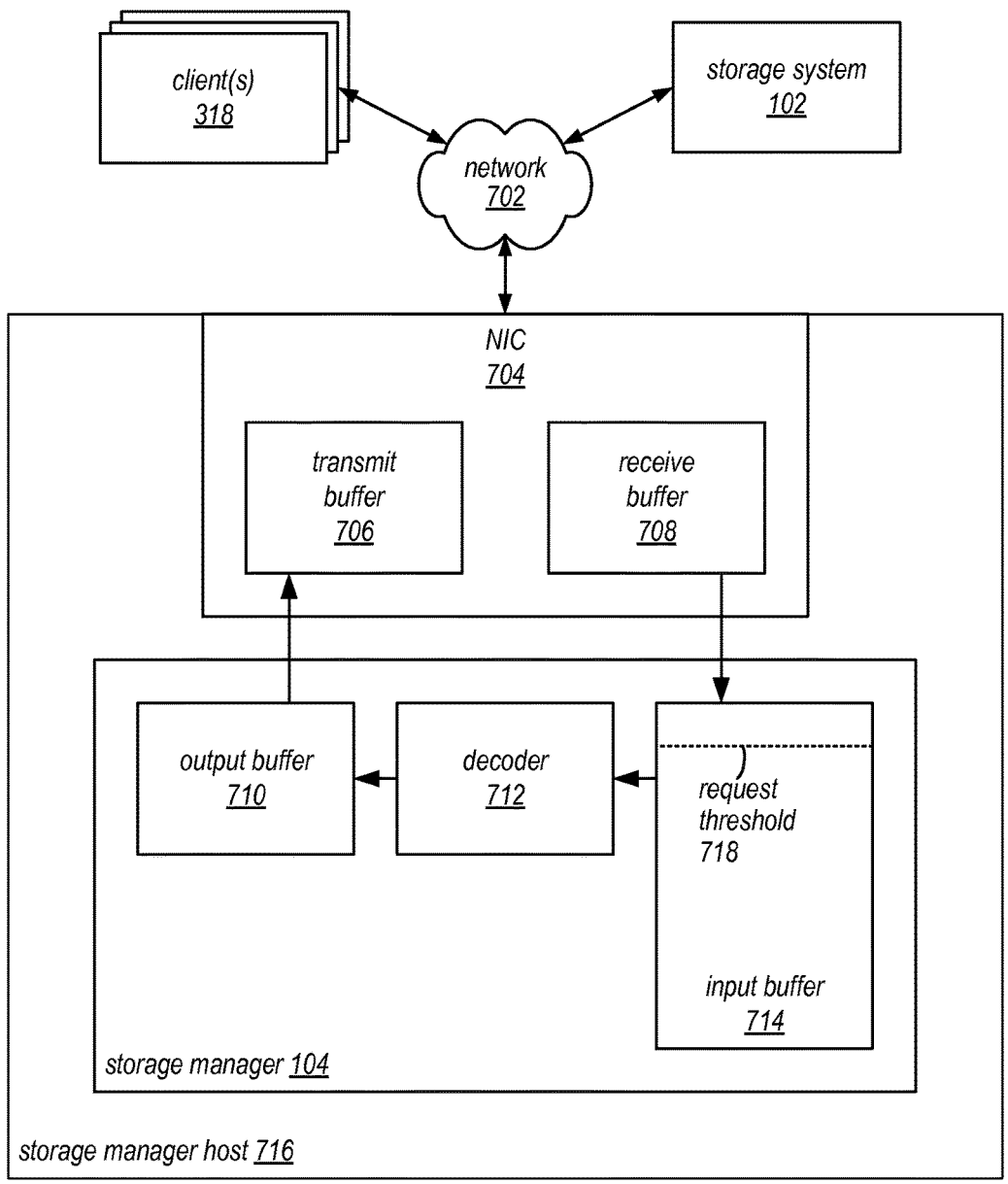
FIG. 7A is a block diagram illustrating a service system architecture that may be configured to receive a request for a data object and to decode and send a block of the data object.

FIG. 7A is a block diagram illustrating a service system architecture that may be configured to receive a request for a data object and to decode and send a block of the data object. In this example, the system includes the storage system 102 and the storage manager 104 of FIGS. 1A and 1B and a plurality of clients, including the client 318 of FIG. 3. However, in other embodiments the storage system 102, the storage manager 104, the client 318, or any combination thereof differ from the storage systems, storage managers, and clients discussed in FIGS. 1A, 1B, and 3. The system also includes a network 702 that links the storage manager 104 to the storage system 102 and to the client 318. The system includes a storage manager host 716, a network device that includes the storage manager 104 and a network interface card (NIC) 704. The NIC 704 includes a transmit buffer 706 and a receive buffer 708. The storage manager 104 includes an input buffer 714 having a request threshold 718, a decoder 712, and an output buffer 710. In some embodiments, the decoder 712 corresponds to the decoder 310 of FIG. 3. In some embodiments, the storage manager host 716 includes multiple NICs and is connected to the storage system 102 and to the client 318 via separate networks.

This disclosure will describe a process of receiving a corresponding blocks of a data object, decoding the corresponding blocks, and returning a decoded block using a processing pipeline technique.

As noted above, the storage system 102 may be configured to store a plurality of data objects on behalf of various clients according to a sharding technique using corresponding pluralities of storage devices (e.g., that form various shard groups). In some embodiments, clients, such as the client 318, may request, to storage manager 104 via network 702, a data object stored at the storage system 102 on the client's behalf In response to requests to a request group, corresponding blocks may be transmitted by storage system 102 to storage manager host 716.

In some embodiments, the blocks may be received at the receive buffer 708. A process (e.g., controlled by the NIC 704) may transfer the blocks from the receive buffer 708 to the input buffer 714. As further described below with reference to FIG. 7B, the storage manager 104 may monitor the input buffer 714 to determine whether the input buffer 714 includes a sufficient number of corresponding blocks to decode a block of the data object. Based at least in part on detecting that the input buffer 714 stores the sufficient number of corresponding blocks to decode the block, the corresponding blocks may be sent to decoder 712, where they may be reconstructed into a block of the data object and stored at output buffer 710. Reconstructed blocks may be transferred from the output buffer 710 to the transmit buffer 706 to be sent to the client 318.

Figure 8A:
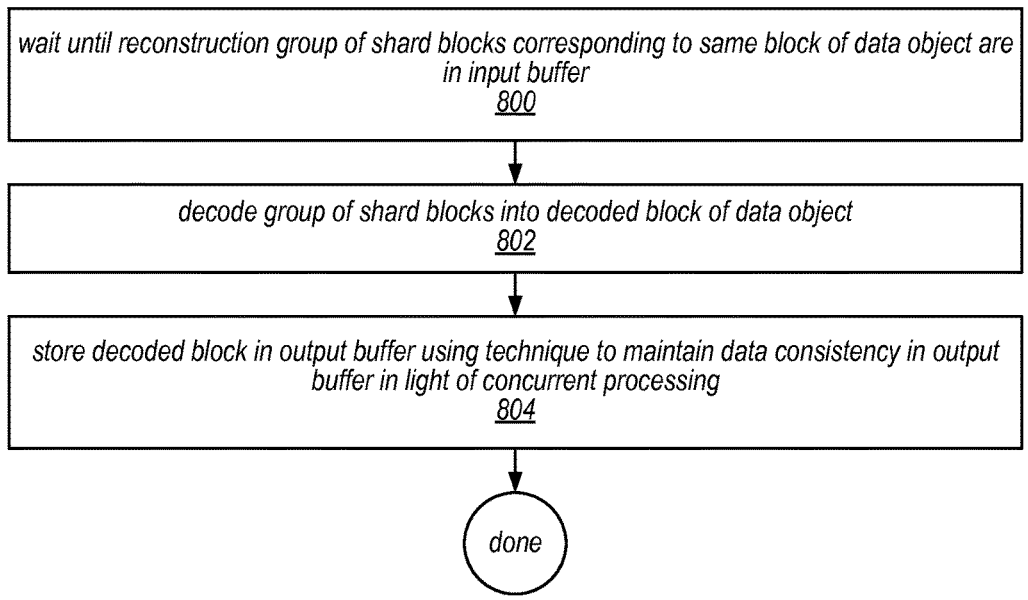
FIG. 8A is a flow diagram illustrating one embodiment of a method for decoding and storing a block of a data object.
Figure 8B:
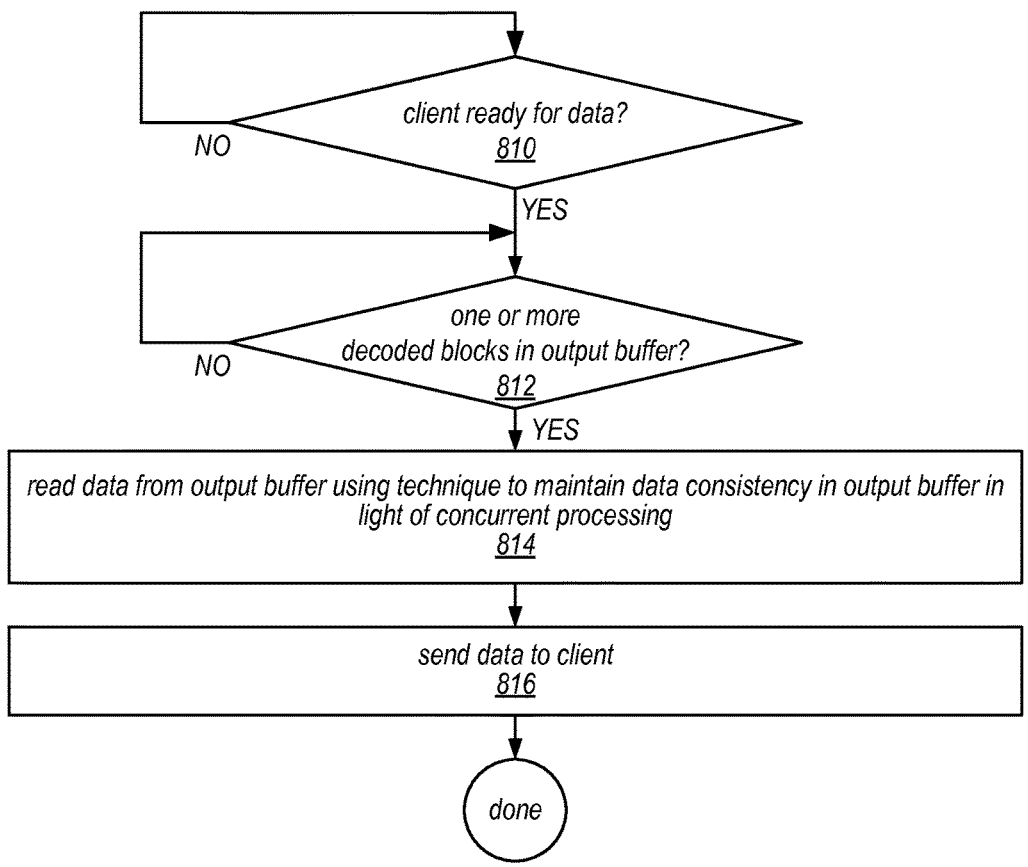
FIG. 8B is a flow diagram illustrating one embodiment of a method for sending a block of a data object to a client.

As further described below with reference to FIGS. 8A and 8B, the storage manager 104 may enforce consistency of data stored in the output buffer 710 in at least one of a few different ways. In some embodiments, the storage manager 104 utilizes a single thread and thus temporarily pauses a decoding operation based at least in part on one or more blocks being stored at the output buffer 710 and on receiving an indication that the transmit buffer 706 is empty and the client 318 is ready to receive at least one block of the data object. While the decoding process is paused, the storage manager 104 may send at least one block to the transmit buffer 706 and initiate the transmission of the at least one block to the client 318. Alternatively, the storage manager 104 may include multiple threads and may enforce consistency of the data at the output buffer through the use of one or more consistency maintenance mechanisms (e.g., locks).

The storage manager 104 may monitor the input buffer 714 to determine when to request additional blocks of the data object and to determine how many blocks of the data object to request. More specifically, the input buffer 714 may be filled with encoded blocks after a request is sent, but may be emptied by the decoder 712 as blocks are decoded. In response to the input buffer 714 being emptied beyond the request threshold 718, the storage manager 104 may be configured to request additional blocks from a new request group, as described above. The request threshold 718 may represent a percentage of the input buffer 714 being empty (e.g., 80%), rather than the entire input buffer 714 being empty. Accordingly, the storage manager 104 may request additional blocks before the decoder 712 empties the input buffer 714, thus potentially keeping the decoder 712 from running out of blocks to decode. The storage manager 104 may determine a number of blocks to request from the request group based on an amount of empty space in the input buffer 714 (e.g., such that the input buffer 714 is not overloaded). Accordingly, the management of the input buffer by the storage manager 104 may allow the decoder 712 to decode blocks of the data object in parallel with requesting additional blocks and without potentially overloading the input buffer.

In some embodiments, a first block request may request fewer blocks, as compared to subsequent block requests (so the performance data may be gathered more quickly). However, in some embodiments, more than one block may still be requested so the decoder 712 may continue to decode blocks while additional corresponding blocks are requested from the new request group, thus maintaining parallelism in the decoding process.

Figure 7B:
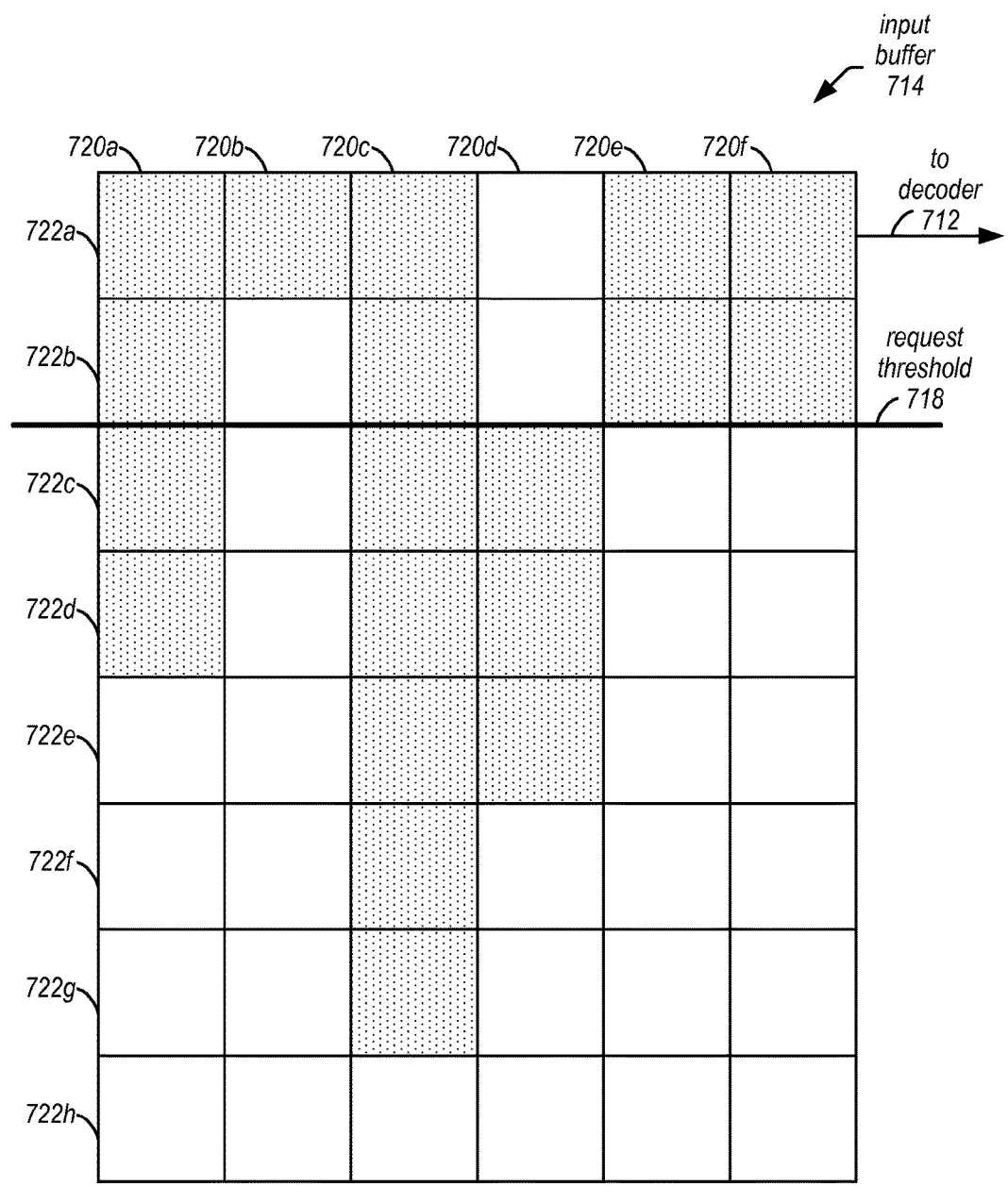
FIG. 7B is a block diagram illustrating operations of one embodiment of an input buffer of a storage manager.

FIG. 7B is a block diagram illustrating operations of one embodiment of an input buffer of a storage manager. In this example, the input buffer 714 of FIG. 7A is illustrated. However, in other embodiments, the input buffer 714 of FIG. 7B differs from the input buffer 714 of FIG. 7A. The input buffer 714 includes the request threshold 718 of FIG. 7A, input columns 720a-f, and input rows 722a-h. Although the input buffer 714 is described herein as only storing blocks for a single data object, in other embodiments, the input buffer 714 may store blocks for multiple data objects (e.g., in response to multiple client requests).

In some embodiments, each of the input columns 720a-f correspond to a respective storage device of a connection group. For example, the input columns 720a-f may correspond to the storage devices 106a, 106b, 106d, 106e, 106f, and 106h, respectively, of FIGS. 1A-1B. Each of the input rows 722a-f may correspond to a respective block of a requested data object. Portions of the input buffer 714 are patterned (hatched) and other portions of the input buffer 714 are unpatterned (non-hatched). The patterned portions denote, in this example, portions of a block of a data object that have been received from a corresponding storage device and the unpatterned portions denote portions of a block of a data object that have not been received from a corresponding storage device (e.g., free space). For example, the patterned portion at the row 722a and column 722a indicates that the input buffer 714 stores a corresponding encoded block from a particular storage device (e.g., the storage device 106a) of a connection group for a particular block of a data object. As a further example, the unpatterned portion at the row 722a and the column 720d indicates that the input buffer 714 does not store a corresponding encoded block from a particular storage device (e.g., the storage device 106e) of the connection group for the particular block of the data object.

As described above, when a sufficient number of corresponding blocks are received to reconstruct a block of the data object (e.g., the particular number corresponding to the reconstruction group), the corresponding blocks are sent to the decoder 712. In the illustrated embodiment, the particular number is four. Accordingly, at least some of the blocks of the row 722a may be sent to the decoder 712. Additionally, in the illustrated embodiment, the row 722b includes a sufficient number of corresponding blocks to reconstruct a block of the data object. The input buffer 714 may wait until the decoder 712 has finished decoding the corresponding blocks of the row 722a or the input buffer 714 may send the blocks of the row 722b to another decoder of the storage manager 104. The decoders of the storage manager 104 may be configured to ensure that the client 102 does not receive blocks of the data object out of order. After corresponding blocks of a row (e.g., the row 722a) are sent to the decoder 712, the corresponding blocks may be removed from the row 722a.

As described above, the request threshold 718 may be used to determine when to request additional blocks of the data object and to determine how many blocks of the data object to request. In response to an amount of free space exceeding the threshold amount (e.g., corresponding to the request threshold 718), the storage manager 104 may request additional blocks. The additional requested blocks may be determined based on the amount of free space. In the illustrated embodiment, the request threshold 718 corresponds to a number of rows 722 (e.g., sets of corresponding blocks) to be decoded. However, in other embodiments, the request threshold 718 corresponds to a number of corresponding blocks stored at the input buffer 714. In some cases, the request threshold 718 may be adjustable (e.g., based on the performance data of the storage devices) such that if the storage devices are taking longer to return the blocks of the data object, the request threshold 718 is reduced (e.g., the input buffer 714 is more full when additional blocks are requested).

In some cases, more corresponding blocks may be received than the particular number. For example, the row 722a includes five corresponding blocks. In the illustrated embodiment, when the input buffer 714 stores at least the particular number of corresponding blocks and the input buffer 714 receives additional corresponding blocks, the input buffer 714 stores the additional corresponding blocks (e.g., in case of an error in one of the other blocks). The additional corresponding blocks may be left in corresponding rows of the input buffer 714 until the block of the data object is decoded or may be stored in another portion of the input buffer 714 (not shown). However, in other embodiments, some or all of the additional corresponding blocks may be discarded. For example, the input buffer 714 may retain information regarding one or more rows sent to the decoder 712 so when an additional corresponding block is received, the additional corresponding block may be discarded. In some embodiments, rather than being sized based on the connection group, the input buffer 714 is sized such that only the particular number of corresponding blocks may be stored (e.g., the first four corresponding blocks received are stored at the input buffer 714).

As described above, in one example of a storage service, a client may request a data object from storage in a storage system that includes a plurality of data storage devices. A storage manager may iteratively decode blocks of the data object while new blocks are provided to the storage manager from the storage service and while blocks are output to the client. One embodiment of a method for decoding and storing a block of a data object is illustrated by the flow diagram of FIG. 8A. Although FIG. 8A illustrates operations being performed in a particular order, in other embodiments, some operations may be performed in other orders or in parallel.

As illustrated at 800, in this example, the method may include waiting until a reconstruction group of shard blocks corresponding to a same block of a data object is in an input buffer. For example, as described above with reference to FIG. 7, the decoder 712 may wait until enough corresponding blocks are in the input buffer 714 to perform a decoding operation on the corresponding blocks. As illustrated at 802, in this example, the method may include decoding the group of shard blocks into a decoded block of the data object. For example, the decoder 712 may decode a group of corresponding blocks of a data object into a decoded block of the data object.

As illustrated at 804, in this example, the method may include storing the decoded block in an output buffer using a technique to maintain data consistency in the output buffer in light of concurrent processing. For example, the decoder 712 may store a decoded block in the output buffer 710 using a technique such as only utilizing a single thread or using a locking mechanism to maintain data consistency in the output buffer 710. Thus, the method of FIG. 8A may enable decoding and storing a block of a data object.

As described above, in one example of a storage service, a client may request a data object from storage in a storage system that includes a plurality of data storage devices. A storage manager may iteratively decode blocks of the data object while new blocks are provided to the storage manager from the storage service and while blocks are output to the client. One embodiment of a method for sending a block of a data object to a client is illustrated by the flow diagram of FIG. 8B. Although FIG. 8B illustrates operations being performed in a particular order, in other embodiments, some operations may be performed in other orders or in parallel.

As illustrated at 810, in this example, the method may include determining whether a client is ready for data. For example, as described above with reference to FIG. 7, the NIC 704 may check whether the client 318 is ready to receive data from the storage manager 104. If the client is not yet ready to receive data, the method may include continuing to check whether the client is ready to receive data. Otherwise, if the client is ready to receive data, the method may proceed to 812. As illustrated at 812, in this example, the method may include determining whether one or more decoded blocks is in an output buffer. For example, the NIC 704 may determine whether one or more decoded blocks of the data object are stored in the output buffer 710 of the storage manager 104. If a block is not stored in the output buffer, the method may include continuing to check whether one or more decoded blocks are stored in the output buffer. If a block is stored in the output buffer, the method may proceed to 814.

As illustrated at 814, in this example, the method may include reading data from the output buffer using a technique to maintain data consistency in the output buffer in light of concurrent processing. For example, the NIC 704 may read data from the output buffer 710, placing the data in the transmit buffer 706. Reading the data may be performed using a single thread to decode the data and to send the data to the client, using a lock-based mechanism, or using another way (e.g., atomic writes or reversible reads) to maintain data consistency in the output buffer 710. As illustrated at 816, in this example, the method may include sending the data to the client 816. For example, the NIC 704 may send the data from the transmit buffer 706 to the client 318. Thus, the method of FIG. 8B may enable sending a block of a data object to a client.

Figure 9:
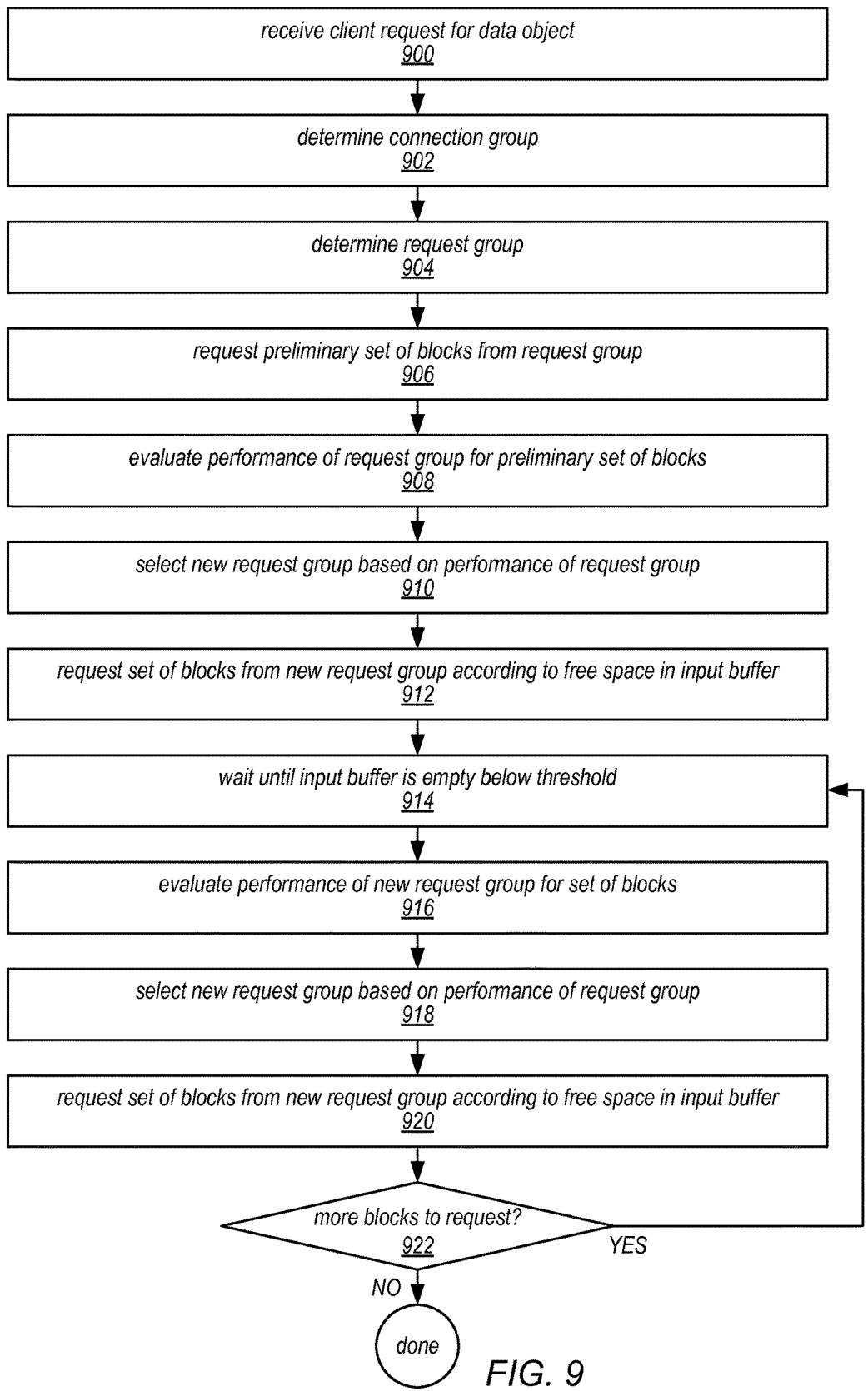
FIG. 9 is a flow diagram illustrating one embodiment of a method for decoding a data object in a storage service by refining transmission times of blocks of the data object.

As described above, in one example of a storage service, a client may request a data object from storage in a storage system that includes a plurality of data storage devices. A storage manager may iteratively retrieve the data object from storage by requesting various groups of corresponding blocks from various request groups. The storage manager may evaluate performance of the storage devices in supplying the requested blocks and may modify membership of the request group prior to a future request. One embodiment of a method for decoding a data object in a storage service by refining transmission times of blocks of the data object is illustrated by the flow diagram of FIG. 9. Although FIG. 9 illustrates operations being performed in a particular order, in other embodiments, some operations may be performed in other orders or in parallel.

As illustrated at 900, in this example, the method may include receiving a client request for a data object. For example, the storage manager 104 of FIGS. 1A, 1B, and 7A may receive a request for a data object stored at the storage system 102. In some embodiments, after receiving the client request at 900, the storage manager may determine whether a requested data object is large enough to perform the rest of the method of FIG. 9. For example, if the data object only includes a single block, the storage manager may decide not to perform the rest of the method. As illustrated at 902, in this example, the method may include determining a connection group. For example, the storage manager 104 may determine a connection group of storage devices 106a, 106b, 106d, 106e, 106f, and 106h. As discussed above, the connection group may be determined by various methods including randomly or using previous performance data of storage devices of a shard group associated with the data object.

As illustrated at 904, the method may include determining a request group. For example, the storage manager 104 may determine a request group of storage devices 106a, 106b, 106d, 106f, and 106h. In some cases, the request group may be determined based on which storage devices of the connection group established connections with the storage manager 104 most quickly. As illustrated at 906, the method may include requesting a preliminary set of blocks from the request group. For example, the storage manager 104 may request a preliminary set of blocks from the request group of storage devices 106a, 106b, 106d, 106f, and 106h. In some cases, the preliminary set of blocks may request fewer blocks than another, subsequent request for blocks.

As illustrated at 908, the method may include evaluating performance of the request group for the preliminary set of blocks. For example, the storage manager 104 may evaluate performance data of the request group of storage devices 106a, 106b, 106d, 106f, and 106h for the preliminary set of blocks. In one case, the storage manager 104 may determine that the storage device 106b failed to meet performance criteria and thus is an underperforming storage device. As illustrated at 910, the method may include selecting a new request group based on the performance of the request group. For example, the storage manager may select the new request group of storage devices 106a, 106d, 106e, 106f, and 106h. In some embodiments, the new request group of storage devices may be the same as the request group of storage devices.

As illustrated at 912, the method may include requesting a set of blocks from the new request group according to free space in an input buffer. For example, the storage manager 104 may request a number of corresponding blocks from the new request group to fill the input buffer 714. As discussed above, more blocks may be requested, as compared to the number of blocks requested after forming the (original) request group. As illustrated at 914, the method may include waiting until the input buffer is empty below a threshold. For example, the storage manager 104 may wait until the decoder 712 has emptied the input buffer 714 below the request threshold 718.

As illustrated at 916, the method may include evaluating performance of the new request group for the set of blocks (requested from the new request group). For example, the storage manager 104 may evaluate performance data of the request group of storage devices 106a, 106d, 106e, 106f, and 106h for the set of blocks. As illustrated at 918, the method may include selecting a new request group based on the performance of the request group. For example, the storage manager 104 may evaluate the performance of the request group of storage devices 106a, 106d, 106e, 106f, and 106h and select a new request group of the storage devices 106b, 106d, 106e, 106f, and 106h based at least in part on the performance of the storage devices 106a, 106d, 106e, 106f, and 106h. The new request group may be the same as the previous new request group as the request group, or both.

As illustrated at 920, the method may include requesting a set of blocks from the new request group according to free space in the input buffer. For example, the storage manager 104 may request a number of corresponding blocks from the new request group to (again) fill the input buffer 714. The request may ask for more blocks or fewer blocks, as compared to previous requests for sets of blocks from request groups. As illustrated at 922, the method may include determining whether more blocks have not yet been requested. If additional blocks need to be requested to complete the decoding process of the data object, the method returns to 914. Otherwise, the method completes. Thus, the method of FIG. 9 may enable decoding a data object in a storage service by refining transmission times of blocks of the data object.

Figure 10:
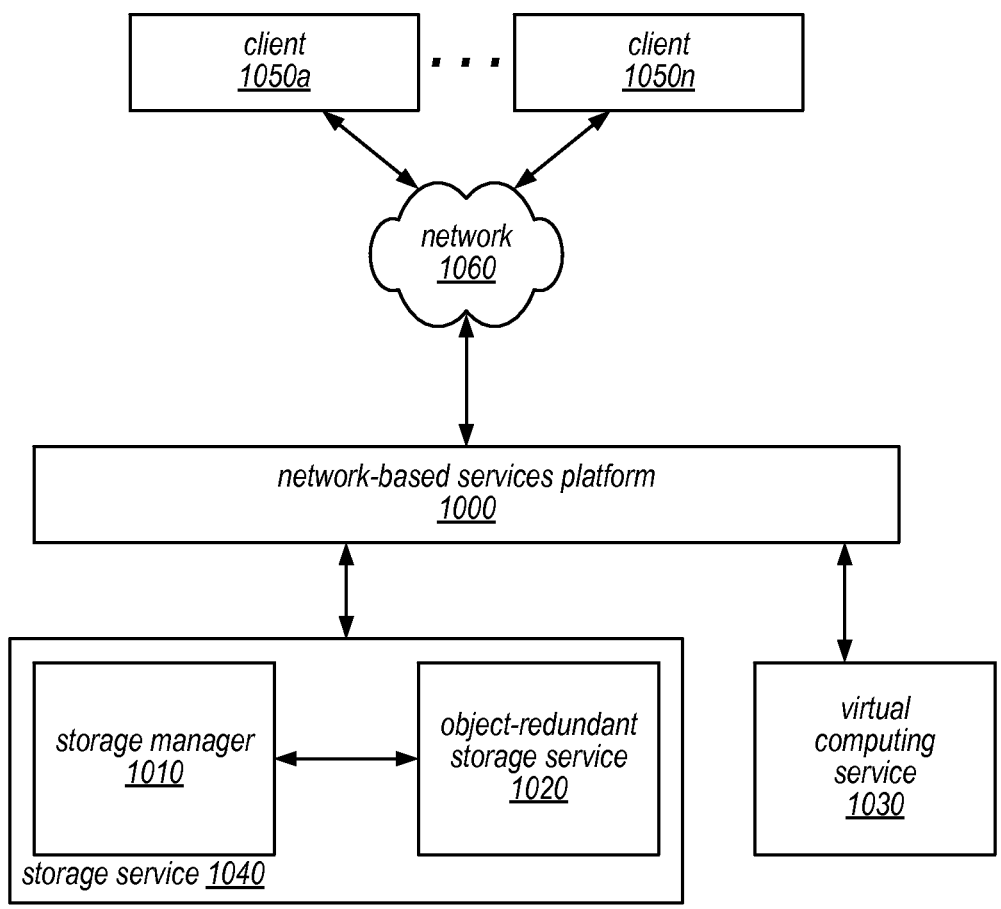
FIG. 10 is a block diagram illustrating a service system architecture that may be configured to implement an object-redundant storage service using a storage manager, according to some embodiments.

One embodiment of a service system architecture that may be configured to implement a network services-based storage service including the systems described by FIGS. 1A-9 is shown in FIG. 10. In the illustrated embodiment, a number of clients (shown as clients 1050a-1050n) may be configured to interact with a network-based services platform 1000 via a network 1060. The network-based services platform 1000 may be configured to interface with one or more instances of a storage service 1040 and/or a virtual computing service 1030. The storage service 1040 may include a storage manager 1010 and an object-redundant storage service 1020. The storage manager 1010 may be configured to interface with the object-redundant storage service 1020. In some embodiments, the storage manager 1010 corresponds to the storage manager 104 of FIGS. 1A, 1B, 3, 7, or any combination thereof and the object-redundant storage service 1020 includes the storage system 102 of FIGS. 1A, 1B, 3, 7, or any combination thereof. It is noted that where one or more instances of a given component may exist, reference to that component herein may be made in either the singular or the plural. However, usage of either form is not intended to preclude the other.

In various embodiments, the components illustrated in FIG. 10 may be implemented directly within computer hardware, as instructions directly or indirectly executable by computer hardware (e.g., a microprocessor, a computer system, or one or more hardware processors), or using a combination of these techniques. For example, the components of FIG. 10 may be implemented by a distributed system including a number of computing nodes (or simply, nodes), such as the computer system embodiment shown in FIG. 11 and discussed below. In various embodiments, the functionality of a given service system component (e.g., the storage manager 1010) or a portion of a given service system component (e.g., the decoder 310) may be implemented by a particular node or distributed across several nodes. In some embodiments, a given node may implement the functionality of more than one service system component.

Generally speaking, the clients 1050a-n may encompass any type of client configurable to submit web services requests to the network-based services platform 1000 via the network 1060, including requests for storage services. For example, a given client 1050a may include a suitable version of a web browser, or a plugin module or other type of code module configured to execute as an extension to or within an execution environment provided by a web browser. Alternatively, a client 1050 (e.g., a storage service client) may encompass an application such as a database application, media application, office application or any other application that may make use of persistent storage resources. In some embodiments, such an application may include sufficient protocol support (e.g., for a suitable version of Hypertext Transfer Protocol (HTTP)) for generating and processing network services requests without necessarily implementing full browser support for all types of network-based data. That is, the client 1050 may be an application configured to interact directly with the network-based services platform 1000. As described herein, the client 1050 may be configured to generate network services requests according to a Representational State Transfer (REST)-style network services architecture, a document- or message-based network services architecture, or another suitable network services architecture.

In other embodiments, a client 1050 (e.g., a storage service client) may be configured to provide access to network services-based storage to other applications in a manner that is transparent to those applications. For example, the client 1050 may be configured to integrate with an operating system or file system to provide storage in accordance with a suitable variant of the storage model described herein. However, the operating system or file system may present a different storage interface to applications, such as a conventional file system hierarchy of files, directories and/or folders. In such an embodiment, applications may not need to be modified to make use of the storage system service models described above. Instead, the details of interfacing to the network-based services platform 1000 may be coordinated by the client 1050 and the operating system or file system on behalf of applications executing within the operating system environment.

The clients 1050a-n may convey web services requests to and receive responses from the network-based services platform 1000 via the network 1060. In various embodiments, the network 1060 may encompass any suitable combination of networking hardware and protocols necessary to establish network-based communications (e.g., web-based communications) between the clients 1050a-n and the network-based services platform 1000. For example, the network 1060 may generally encompass the various telecommunications networks and service providers that collectively implement the Internet. The network 1060 may also include private networks such as local area networks (LANs) or wide area networks (WANs) as well as public or private wireless networks. For example, both a given client 1050*a* and the network-based services platform 1000 may be respectively provisioned within enterprises having their own internal networks. In such an embodiment, the network 1060 may include the hardware (e.g., modems, routers, switches, load balancers, proxy servers, etc.) and software (e.g., protocol stacks, accounting software, firewall/security software, etc.) necessary to establish a networking link between given client 1050*a* and the Internet as well as between the Internet and the network-based services platform 1000. It is noted that in some embodiments, the clients 1050*a-n* may communicate with the network-based services platform 1000 using a private network rather than the public Internet. For example, the clients 1050*a-n* may be provisioned within the same enterprise as a storage service system (e.g., a system that implements the storage manager 1010). In such a case, the clients 1050*a-n* may communicate with the network-based services platform 1000 entirely through a private network (e.g., a LAN or WAN that may use Internet-based communication protocols but which is not publicly accessible).

Generally speaking, the network-based services platform 1000 may be configured to implement one or more service endpoints configured to receive and process web services requests, such as requests to encode data objects or requests to decode data objects. For example, the network-based services platform 1000 may include hardware and/or software configured to implement a particular endpoint, such that an HTTP-based web services request directed to that endpoint is properly received and processed. In one embodiment, the network-based services platform 1000 may be implemented as a server system configured to receive web services requests from the clients 1050*a-n* and to forward them to components of a storage manager 1010 of the storage service 1040 to provide an object-redundant storage service 1020. Alternatively, the web services requests may be forwarded to another virtual computing service 1030 for processing. In other embodiments, the network-based services platform 1000 may be configured as a number of distinct systems (e.g., in a cluster topology) implementing load balancing and other request management features configured to dynamically manage large-scale web services request processing loads. In various embodiments, the network-based services platform 1000 may be configured to support REST-style or document-based (e.g., SOAP-based) types of web services requests.

In addition to functioning as an addressable endpoint for clients' web services requests, in some embodiments, the network-based services platform 1000 may implement various client management features. For example, the network-based services platform 1000 may coordinate the metering and accounting of client usage of network services, including storage resources, such as by tracking the identities of requesting clients 1050*a-n*, the number and/or frequency of client requests, the size of objects stored or retrieved on behalf of clients 1050*a-n*, overall storage bandwidth used by clients 1050*a-n*, class of storage requested by clients 1050*a-n*, or any other measurable client usage parameter. The network-based services platform 1000 may also implement financial accounting and billing systems, or may maintain a database of usage data that may be queried and processed by external systems for reporting and billing of client usage activity. In certain embodiments, the network-based services platform 1000 may be configured to collect, monitor and/or aggregate a variety of storage service system operational metrics, such as metrics reflecting the rates and types of requests received from the clients 1050*a-n*, bandwidth utilized by such requests, system processing latency for such requests, system component utilization (e.g., network bandwidth and/or storage utilization within the storage service system), rates and types of errors resulting from requests, characteristics of requested objects (e.g., size, data type, etc.), or any other suitable metrics. In some embodiments such metrics may be used by system administrators to tune and maintain system components, while in other embodiments such metrics (or relevant portions of such metrics) may be exposed to the clients 1050*a-n* to enable such clients to monitor their usage of the storage service 1040 and/or another virtual computing service 1030 (or the underlying systems that implement those services).

In some embodiments, the network-based services platform 1000 may also implement user authentication and access control procedures. For example, for a given web services request to access a particular data object (e.g., an encoded/encrypted data object) stored at the object-redundant storage service 1020, the network-based services platform 1000 may be configured to ascertain whether the client 1050 associated with the request is authorized to access the particular data object. The network-based services platform 1000 may determine such authorization by, for example, evaluating an identity, password or other credential against credentials associated with the particular data object, or evaluating the requested access to the particular data object against an access control list for the particular data object. For example, if a client 1050 does not have sufficient credentials to retrieve the particular object, the network-based services platform 1000 may reject the corresponding network services request, for example by returning a response to the requesting client 1050 indicating an error condition. Various access control policies may be stored as records or lists of access control information by the storage service 1040, the storage manager 1010, the object-redundant storage service 1020 and/or the other virtual computing services 1030.

While in some embodiments, a storage service 1040 that implements an object-redundant storage service 1020 may support data objects of arbitrary sizes, in other embodiments, data objects may be constrained to a certain maximum size, also referred to as a chunk size. In some such embodiments, when a client 1050 provides an object to be stored by the object-redundant storage service 1020, and the object exceeds the chunk size, the network-based services platform 1000 may be configured to divide the object into two or more chunks according to the chunk size. In one embodiment, the network-based services platform 1000 may be configured to store each chunk as a respective data object that is encoded and decoded separately. In other words, the storage manager 1010 may separately encode and decode each chunk. In other embodiments, when a client provides an object to be stored by the object-redundant storage service 1020 and the object exceeds the chunk size, the network-based services platform 1000 may be configured to return a response to the requesting client 1050 indicating an error condition.

It is also noted that while the network-based services platform 1000 may represent the primary interface through which clients 1050*a-n* may access the features of a storage system that implements the object-redundant storage service 1020 via the storage manager 1010, the network-based services platform 1000 need not represent the sole interface to such features. For example, an alternate API that may be distinct from a network services interface may be used to allow clients internal to the enterprise providing the storage service system to bypass the network-based services platform 1000. In another example, a virtual computing service 1030 may configured to bypass the network-based services platform 1000 and to implement an API directly between the virtual computing service 1030 and a the storage manager 1010 to store objects used in performing the virtual computing service 1030 on behalf of a client 1050. In some cases, the accounting and/or credentialing services of the network-based services platform 1000 may be unnecessary for internal clients such as administrative clients or between service components within the same enterprise.

Note that while several examples included herein describe transmission time refinement in an object-redundant storage service as a web-based service exposed to storage service clients, in other embodiments, the object-redundant storage service may be internal to a computing system or an enterprise system and may not be exposed to external clients (e.g., users or client applications). For example, a client may store objects to a primary storage service (a storage service other than an object-redundant storage service), and the primary storage service or an operating system (or another system component) may cause the object (or a replica or shard thereof) to be stored to an object-redundant storage service instead of or in addition to storing the object to the primary storage service. In another example, the operating system, a backup process, or another system component may back up a primary storage system (e.g., periodically, automatically or in response to a request to do so) to an object-redundant storage system. In these examples, the "client" of the object-redundant storage service 1020 may be another application internal to a network-based services platform (such as the virtual computing service 1030 illustrated in FIG. 10). In such embodiments, the client may access the storage manager 1010 of the object-redundant storage service 1020 over a local or private network, rather than over the Internet.

Figure 11:
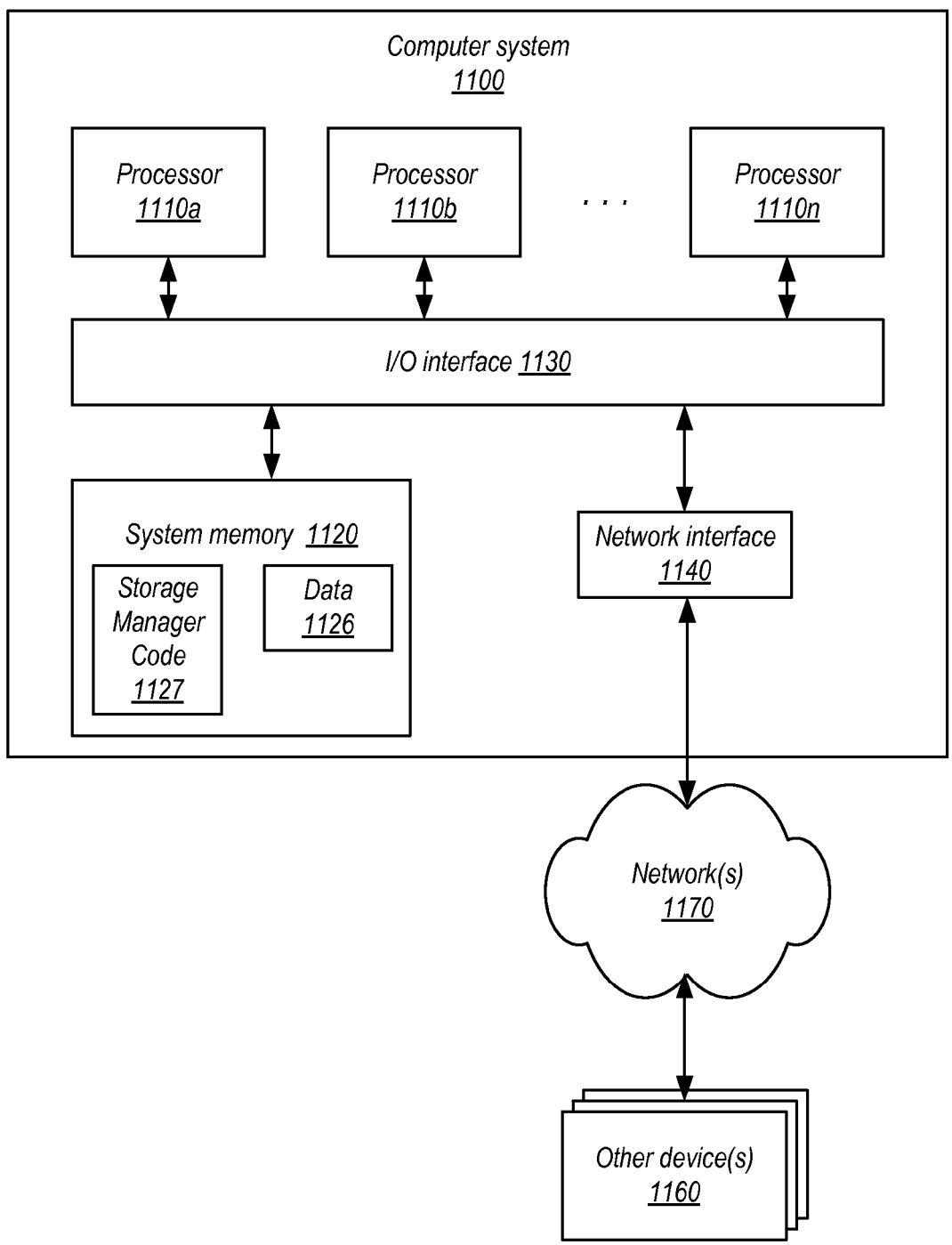
FIG. 11 is a block diagram illustrating one embodiment of a computer system configured to implement at least a portion of a storage manager, as described herein.

One embodiment of a computer system configured to implement at least a portion of a storage manager such as the storage manager 104 of FIG. 1A, 1B, 3, or 7A is shown in FIG. 11. In at least some embodiments, a server that implements a portion or all of the methods and apparatus for transmission time refinement in object-redundant storage systems as described herein may include a general-purpose computer system that includes or is configured to access one or more computer-accessible media, such as a computer system 1100 illustrated in FIG. 11. In the illustrated embodiment, the computer system 1100 includes one or more processors 1110a-n coupled to a system memory 1120 via an input/output (I/O) interface 1130. The computer system 1100 further includes a network interface 1140 coupled to the I/O interface 1130.

In various embodiments, the computer system 1100 may be a uniprocessor system including one processor 1110a, or a multiprocessor system including several processors 1110a-n (e.g., two, four, eight, or another suitable number). The processors 1110a-n may be any suitable processors capable of executing instructions. For example, in various embodiments, the processors 1110a-n may be general-purpose or embedded processors implementing any of a variety of instruction set architectures (ISAs), such as the x86, PowerPC, SPARC, or MIPS ISAs, or any other suitable ISA. In multiprocessor systems, each of the processors 1110a-n may commonly, but not necessarily, implement the same ISA.

System memory 1120 may be configured to store instructions and data accessible by the processor(s) 1110. In various embodiments, the system memory 1120 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above for transmission time refinement in object-redundant storage systems, are shown stored within the system memory 1120 as storage manager code 1127 and data 1126.

In one embodiment, the I/O interface 1130 may be configured to coordinate I/O traffic between a processor 1110, the system memory 1120, and any peripheral devices in the device, including the network interface 1140 or other peripheral interfaces. In some embodiments, the I/O interface 1130 may perform any necessary protocol, timing or other data transformations to convert data signals from one component (e.g., the system memory 1120) into a format suitable for use by another component (e.g., a processor 1110). In some embodiments, the I/O interface 1130 may include support for devices attached through various types of peripheral buses, such as a variant of the Peripheral Component Interconnect (PCI) bus standard or the Universal Serial Bus (USB) standard, for example. In some embodiments, the function of the I/O interface 1130 may be split into two or more separate components, such as a north bridge and a south bridge, for example. Also, in some embodiments some or all of the functionality of the I/O interface 1130, such as an interface to the system memory 1120, may be incorporated directly into a processor 1110.

The network interface 1140 may be configured to allow data to be exchanged between the computer system 1100 and other devices 1160 attached to a network or networks 1170, such as other computer systems or devices as illustrated or described in FIGS. 1A through 10, for example. In various embodiments, the network interface 1140 may support communication via any suitable wired or wireless general data networks, such as types of Ethernet network, for example. Additionally, the network interface 1140 may support communication via telecommunications/telephony networks such as analog voice networks or digital fiber communications networks, via storage area networks such as Fibre Channel SANs, or via any other suitable type of network and/or protocol.

In some embodiments, the system memory 1120 may be one embodiment of a computer-accessible medium configured to store program instructions and data as described above for FIGS. 1A through 10 for implementing embodiments of transmission time refinement when decoding data objects in storage systems (e.g., distributed storage systems). However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to the computer system 1100 via the I/O interface 1130. A non-transitory computer-accessible storage medium may also include any volatile or non-volatile media such as RAM (e.g. SDRAM, DDR SDRAM, RDRAM, SRAM, etc.), ROM, etc., that may be included in some embodiments of the computer system 1100 as the system memory 1120 or another type of memory. Further, a computer-accessible medium may include transmission media or signals such as electrical, electromagnetic, or digital signals, conveyed via a communication medium such as a network and/or a wireless link, such as may be implemented via the network interface 1140.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
   a storage system comprising a plurality of storage devices, wherein the storage system is configured to store a plurality of data objects according to an erasure encoding technique, wherein each respective data object of the plurality of data objects is stored as a shard group, wherein shards of a respective shard group include respective pluralities of blocks such that blocks of the respective data object can be reconstructed from a particular number of corresponding blocks of the data object from a particular number of storage devices, and wherein each shard of the shard group is stored on a different one of the plurality of storage devices than any other shard of the shard group; and
   a storage manager implemented by one or more hardware processors and configured to:
      receive a request from a client for one of the plurality of data objects;
      maintain connections to a connection group of the storage devices that store respective shards of the data object, wherein the connection group includes a greater number of storage devices than the particular number of storage devices needed to reconstruct blocks of the requested data object;
      request corresponding blocks of the data object from a request group of the storage devices of the connection group, wherein the request group is a subset of the connection group having fewer than all the storage devices of the connection group and having at least the particular number of the storage devices;
      evaluate, based at least in part on performance criteria, performance of the storage devices of the request group in sending the corresponding blocks of the data object;
      modify, based at least in part on evaluating the performance of the request group, membership of the request group to form a new request group using at least one different storage device of the connection group;
      request subsequent corresponding blocks of the data object from the new request group;
      in response to receiving at least the particular number of corresponding blocks from the storage devices of the request group, decode the particular number of corresponding blocks into a reconstructed block of the data object; and
      return the reconstructed block of the data object to the client.

2. The system of claim 1, wherein modifying the membership of the request group is performed based at least in part on determining that at least one of the storage devices fails one or more of the performance criteria, and wherein, to modify the membership of the request group, the storage manager is configured to replace the at least one storage device of the request group with the at least one different storage device from the connection group.

3. The system of claim 2, wherein the storage manager is configured to replace the at least one corresponding storage device with the at least one different storage device using one of the maintained connections without performing a connection initiation process after determining that the at least one of the storage devices fails one or more of the performance criteria.

4. The system of claim 1, wherein the storage manager is further configured to:
   maintain membership of the request group based at least in part on determining that all of the storage devices meet the performance criteria; and
   request the subsequent corresponding blocks of the data object from the request group based at least in part on determining that all of the storage devices meet the performance criteria.

5. The system of claim 1,
   wherein the performance criteria includes a threshold throughput, a threshold response latency, a threshold error rate, or any combination thereof,
   wherein, to evaluate performance of the storage devices, the storage manager is configured to compare, to the performance criteria, performance data of the storage devices in sending the corresponding blocks of the data object to the storage manager,
   wherein the performance data comprises respective throughputs, response latencies, error rates, or any combination thereof.

6. A method, comprising:
   performing, by one or more computers:
      receiving a request from a client for a data object stored at a storage system according to an erasure encoding technique, wherein blocks of the data object can be reconstructed from a particular number of corresponding blocks from a particular number of storage devices of the storage system;
      maintaining connections to a connection group of the storage devices, wherein the connection group includes a greater number of storage devices than the particular number of storage devices needed to reconstruct blocks of the data object;
      requesting corresponding blocks of the data object from a request group of the storage devices of the connection group, wherein the request group is a subset of the connection group having fewer than all the storage devices of the connection group and having at least the particular number of the storage devices;
      evaluating, based at least in part on performance criteria, performance of the storage devices of the request group in sending the corresponding blocks of the data object;
      modifying membership of the request group to form a new request group using at least one different storage device of the connection group; and requesting subsequent corresponding blocks of the data object from the new request group.

7. The method of claim 6, wherein the storage devices of the storage system include respective shards of the data object, wherein the shards of the data object include respective pluralities of the blocks of the data object, wherein the data object can be reconstructed from a particular number of shards from the particular number of storage devices of the storage system, and wherein each shard of the data object is stored on a different one of the plurality of storage devices than any other shard of the data object.

8. The method of claim 6, wherein evaluating the performance of the storage devices comprises identifying a group of one or more underperforming storage devices, wherein the identifying comprises comparing respective performance data of the storage devices in sending the corresponding blocks of the data object to an absolute threshold of the performance criteria.

9. The method of claim 8, wherein evaluating the performance of the storage devices of the request group further comprises:
determining a relative threshold of the performance criteria based at least in part on one or more of the respective performance data of the storage devices in sending the corresponding blocks of the data object;
comparing the respective performance data of storage devices not identified as being underperforming storage devices to the relative threshold and adding one or more storage devices to the group of one or more underperforming storage devices based on the comparing; and
identifying storage devices not in the group of one or more underperforming storage devices as being performant storage devices.

10. The method of claim 9, wherein modifying the membership of the request group to form the new request group further comprises:
selecting performant storage devices to add to the new request group, wherein the selecting comprises:
determining that a number of the performant storage devices exceeds a number of storage devices needed to form the new request group; and
in response to determining that the number of performant storage devices exceeds the number of storage devices needed to form the new request group, adding performant storage devices to the new request group based at least in part on network locality of the performant storage devices to a storage manager performing the requesting the corresponding blocks of the data object.

11. The method of claim 9, wherein modifying the membership of the request group to form the new request group further comprises:
in response to determining that a number of the performant storage devices is insufficient for the new request group, selecting one or more underperforming storage devices to add to the new request group, wherein the selecting comprises:
adding underperforming storage devices to the new request group having least most recently generated performance data.

12. The method of claim 6,
wherein requesting the corresponding blocks of the data object comprises requesting a particular number of corresponding blocks from each storage device of the request group,
wherein requesting the subsequent corresponding blocks of the data object comprises requesting a different particular number of corresponding blocks from each storage device of the new request group, and
wherein the different particular number of corresponding blocks is larger than the particular number of corresponding blocks.

13. The method of claim 6, further comprising:
evaluating, based at least in part on performance criteria, performance of the storage devices of the new request group in sending the subsequent corresponding blocks of the data object;
modifying membership of the new request group to form an updated new request group using at least one different storage device of the connection group; and
requesting additional subsequent corresponding blocks of the data object from the updated new request group.

14. The method of claim 6, further comprising:
evaluating, based at least in part on one or more performance measures, performance of the storage devices of the new request group in sending at least some of the subsequent corresponding blocks of the data object; and
in response to the new request group failing to meet at least one of the one or more performance measures:
adding at least one different storage device of the connection group to the request group; and
requesting blocks from the at least one different storage device corresponding to at least some of the subsequent corresponding blocks of the data object.

15. A non-transitory, computer-readable storage medium storing program instructions that when executed on one or more computers cause the one or more computers to:
implement a storage manager configured to:
receive a request from a client for a data object stored at a storage system according to an erasure encoding technique, wherein blocks of the data object can be reconstructed from a particular number of corresponding blocks from a particular number of storage devices of the storage system;
maintain connections to a connection group of the storage devices, wherein the connection group includes a greater number of storage devices than the particular number of storage devices needed to reconstruct blocks of the data object;
request corresponding blocks of the data object from a request group of the storage devices of the connection group, wherein the request group is a subset of the connection group having fewer than all the storage devices of the connection group and having at least the particular number of the storage devices;
evaluate, based at least in part on performance criteria, performance of the storage devices of the request group in sending the corresponding blocks of the data object; and
modify membership of the request group to form a new request group using at least one different connection of the connection group; and
request subsequent corresponding blocks of the data object from the new request group.

16. The non-transitory, computer-readable storage medium of claim 15, wherein the storage devices of the storage system include respective shards of the data object, wherein the shards of the data object includes respective pluralities of the blocks of the data object, wherein the data object can be reconstructed from a particular number of shards from the particular number of storage devices of the storage system, and wherein each shard of the data object is stored on a different one of the plurality of storage devices than any other shard of the data object.

17. The non-transitory, computer-readable storage medium of claim 15, wherein the storage manager is further configured to:
   in response to receiving at least the particular number of corresponding blocks from the storage devices of the request group, decode the particular number of corresponding blocks into a reconstructed block of the data object,
   wherein decoding the particular number of corresponding blocks is performed subsequent to requesting the subsequent corresponding blocks and prior to receiving at least one of the subsequent corresponding blocks.

18. The non-transitory, computer-readable storage medium of claim 17, wherein the storage manager is further configured to:
   store the corresponding blocks of the data object received from the request group in an input buffer,
   wherein decoding the particular number of corresponding blocks comprises removing the at least the particular number of corresponding blocks from the input buffer, and
   wherein requesting the subsequent corresponding blocks of the data object is performed in response to an amount of free space in the input buffer exceeding a request threshold amount.

19. The non-transitory, computer-readable storage medium of claim 18, wherein, to request subsequent corresponding blocks of the data object from the new request group, the storage manager is further configured to determine, based at least in part on the amount of free space in the input buffer, a number of blocks to request from the new request group.

20. The non-transitory, computer-readable storage medium of claim 18, wherein the storage manager is further configured to:
   store the reconstructed block of the data object in an output buffer; and
   in response to receiving an indication that the client is ready to receive the reconstructed block:
      halt decoding a different particular number of corresponding blocks into a different reconstructed block of the data object;
      initiate transmission of the reconstructed block to the client; and
      resume decoding the different particular number of corresponding blocks into the different reconstructed block.

21. The non-transitory, computer-readable storage medium of claim 18, wherein the storage manager is further configured to:
   store the reconstructed block of the data object in an output buffer using a consistency scheme that prevents the reconstructed block from being read from the output buffer until the storage manager finishes storing the reconstructed block to the output buffer.

* * * * *